US007436227B2

(12) United States Patent
Thomsen et al.

(10) Patent No.: US 7,436,227 B2
(45) Date of Patent: Oct. 14, 2008

(54) DUAL LOOP ARCHITECTURE USEFUL FOR A PROGRAMMABLE CLOCK SOURCE AND CLOCK MULTIPLIER APPLICATIONS

(75) Inventors: Axel Thomsen, Austin, TX (US); Yunteng Huang, Irvine, CA (US); Jerrell P. Hein, Driftwood, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 10/878,218

(22) Filed: Jun. 28, 2004

(65) Prior Publication Data

US 2004/0232995 A1      Nov. 25, 2004

Related U.S. Application Data

(63) Continuation-in-part of application No. 10/675,543, filed on Sep. 30, 2003, now Pat. No. 7,187,241.

(60) Provisional application No. 60/567,479, filed on May 3, 2004, provisional application No. 60/467,813, filed on May 2, 2003.

(51) Int. Cl.
*H03L 7/06* (2006.01)

(52) U.S. Cl. .......................................... 327/147; 331/17

(58) Field of Classification Search .................. 331/10, 331/16, 17, 25; 327/147, 156, 162, 163; 375/373, 375, 376, 374
See application file for complete search history.

(56) References Cited

U.S. PATENT DOCUMENTS 3,676,801 A      7/1972 Musa ................... 331/116 FE (Continued)

FOREIGN PATENT DOCUMENTS

EP      0 239 412 A2     9/1987

(Continued)

OTHER PUBLICATIONS

De Muer, Bram, and Steyaert, Michel S. J., "A CMOS Monolithic ΔΣ-Controlled Fractional-*N* Frequency Synthesizer for DCS-1800," IEEE Journal of Solid-State Circuits, vol. 37, No. 7, Jul. 2002, pp. 835-844.

(Continued)

*Primary Examiner*—Kenneth B. Wells
*Assistant Examiner*—Ryan C Jager
(74) *Attorney, Agent, or Firm*—Zagorin O'Brien Graham LLP

(57) ABSTRACT

A first phase-locked loop (PLL) circuit includes an input for receiving a timing reference signal from an oscillator, a controllable oscillator circuit supplying an oscillator output signal, and a multi-modulus feedback divider circuit. A second control loop circuit is selectably coupled through a select circuit to supply a digital control value (M) to the multi-modulus feedback divider circuit of the first loop circuit to thereby control the oscillator output signal. While the second control loop is coupled to supply the control value to the feedback divider circuit, the control value is determined according to a detected difference between the oscillator output signal and a reference signal coupled to the second control loop circuit at a divider circuit. While the second control loop circuit is not coupled to control the first PLL circuit, the first PLL circuit receives a digital control value to control a divide ratio of the feedback divider, the digital control value is determined at least in part according to a stored control value stored in nonvolatile storage, the stored control value corresponding to a desired frequency of the oscillator output signal.

32 Claims, 12 Drawing Sheets

U.S. PATENT DOCUMENTS

| | | | | |
|---|---|---|---|---|
| 3,719,838 | A | | 3/1973 | Peduto et al. .............. 310/315 |
| 3,813,610 | A | | 5/1974 | Kimura ...................... 331/1 A |
| 3,887,941 | A | | 6/1975 | Dann et al. .................. 386/89 |
| 4,038,612 | A | | 7/1977 | Borofka et al. ............. 331/178 |
| 4,135,158 | A | | 1/1979 | Parmet ...................... 455/143 |
| 4,179,670 | A | * | 12/1979 | Kingsbury ................... 331/10 |
| 4,380,745 | A | | 4/1983 | Barlow et al. ............... 331/176 |
| 4,446,446 | A | | 5/1984 | Fowks ............................ 331/3 |
| 4,485,818 | A | | 12/1984 | Leckrone et al. ............... 607/9 |
| 4,580,107 | A | | 4/1986 | Caldwell et al. .............. 331/10 |
| 4,598,257 | A | | 7/1986 | Southard ....................... 331/2 |
| 4,683,445 | A | | 7/1987 | Erickson ....................... 331/25 |
| 4,689,581 | A | | 8/1987 | Talbot ........................ 331/1 A |
| 4,827,226 | A | | 5/1989 | Connell ................ 331/116 FE |
| 4,847,888 | A | | 7/1989 | Cox et al. .................... 455/400 |
| 4,859,968 | A | | 8/1989 | Gershon ....................... 331/38 |
| 4,891,825 | A | | 1/1990 | Hansen ........................ 377/52 |
| 4,931,748 | A | | 6/1990 | McDermott et al. ......... 331/1 A |
| 4,940,950 | A | | 7/1990 | Helfrick .......................... 331/2 |
| 4,967,165 | A | | 10/1990 | Lee et al. ...................... 331/66 |
| 4,969,210 | A | | 11/1990 | Hansen et al. ........... 455/488.1 |
| 4,996,608 | A | | 2/1991 | Widney ......................... 360/51 |
| 5,038,117 | A | | 8/1991 | Miller .......................... 331/16 |
| 5,041,800 | A | | 8/1991 | Long et al. .................... 331/69 |
| 5,081,431 | A | | 1/1992 | Kubo et al. .................. 331/158 |
| 5,099,153 | A | | 3/1992 | Adams ....................... 327/292 |
| 5,144,254 | A | | 9/1992 | Wilke ......................... 327/107 |
| 5,179,359 | A | | 1/1993 | McLeod ....................... 331/38 |
| 5,180,992 | A | | 1/1993 | Akiyama et al. .............. 331/11 |
| 5,233,351 | A | | 8/1993 | Gregory et al. ............... 342/10 |
| 5,254,958 | A | | 10/1993 | Flach et al. ................... 331/10 |
| 5,257,294 | A | * | 10/1993 | Pinto et al. ................... 375/376 |
| 5,259,007 | A | | 11/1993 | Yamamoto .................. 375/376 |
| 5,263,197 | A | | 11/1993 | Manjo et al. ................. 455/324 |
| 5,266,908 | A | | 11/1993 | Kouloupoulos et al. .......... 331/2 |
| 5,319,324 | A | | 6/1994 | Satoh et al. .................. 331/158 |
| 5,337,024 | A | | 8/1994 | Collins ....................... 332/127 |
| 5,349,544 | A | | 9/1994 | Wright et al. ................... 708/1 |
| 5,416,443 | A | | 5/1995 | Cranford, Jr. et al. .......... 331/2 |
| 5,416,446 | A | | 5/1995 | Holler, Jr. et al. ............. 331/57 |
| 5,425,074 | A | | 6/1995 | Wong .......................... 377/47 |
| 5,428,319 | A | | 6/1995 | Marvin et al. ............... 331/176 |
| 5,448,204 | A | | 9/1995 | Gardner ....................... 331/25 |
| 5,451,912 | A | | 9/1995 | Torode .................... 331/108 C |
| 5,471,661 | A | | 11/1995 | Atkinson ................. 455/165.1 |
| 5,473,289 | A | | 12/1995 | Ishizaki et al. .............. 331/176 |
| 5,473,758 | A | | 12/1995 | Allen et al. .................. 711/150 |
| 5,485,127 | A | * | 1/1996 | Bertoluzzi et al. ............. 331/69 |
| 5,521,948 | A | * | 5/1996 | Takeuchi ..................... 375/376 |
| 5,574,408 | A | | 11/1996 | Zwack ........................ 331/176 |
| 5,579,348 | A | | 11/1996 | Walker et al. ................ 375/355 |
| 5,604,468 | A | | 2/1997 | Gillig .......................... 331/176 |
| 5,781,044 | A | | 7/1998 | Riley et al. .................. 327/105 |
| 5,781,054 | A | * | 7/1998 | Lee ............................. 327/231 |
| 5,790,614 | A | | 8/1998 | Powell ........................ 375/376 |
| 5,834,987 | A | | 11/1998 | Dent ........................... 332/127 |
| 5,847,611 | A | | 12/1998 | Hirata ........................ 331/1 A |
| 5,877,656 | A | | 3/1999 | Mann et al. |
| 5,952,890 | A | | 9/1999 | Fallisgaard et al. ........... 331/18 |
| 5,970,110 | A | * | 10/1999 | Li ................................ 377/48 |
| 6,008,703 | A | * | 12/1999 | Perrott et al. ............... 332/127 |
| 6,043,692 | A | * | 3/2000 | Linoff ......................... 327/117 |
| 6,044,124 | A | | 3/2000 | Monahan et al. ............ 375/376 |
| 6,061,418 | A | | 5/2000 | Hassoun ....................... 377/47 |
| 6,091,943 | A | * | 7/2000 | Nyenhuis .................... 455/260 |
| 6,154,095 | A | * | 11/2000 | Shigemori et al. ............ 331/16 |
| 6,201,448 | B1 | * | 3/2001 | Tam et al. ..................... 331/25 |
| 6,236,703 | B1 | | 5/2001 | Riley .............................. 377/48 |
| 6,404,246 | B1 | | 6/2002 | Estakhri et al. .............. 327/156 |
| 6,456,164 | B1 | | 9/2002 | Fan .............................. 331/16 |
| 6,509,800 | B2 | | 1/2003 | Stockton ...................... 331/11 |
| 6,515,553 | B1 | * | 2/2003 | Filiol et al. .................. 332/127 |
| 6,570,453 | B2 | | 5/2003 | Su et al. ...................... 331/1 A |
| 6,617,893 | B1 | | 9/2003 | Born et al. .................. 327/115 |
| 6,618,462 | B1 | | 9/2003 | Ross et al. ..................... 377/48 |
| 6,664,860 | B2 | | 12/2003 | Fallisgaard et al. ........... 331/18 |
| 6,670,852 | B1 | | 12/2003 | Hauck |
| 6,670,854 | B2 | | 12/2003 | Takeda et al. ............... 331/1 A |
| 6,683,932 | B1 | | 1/2004 | Wood ........................... 377/47 |
| 6,807,552 | B2 | | 10/2004 | Bredin et al. ............... 708/103 |
| 6,850,554 | B1 | * | 2/2005 | Sha et al. .................... 375/140 |
| 6,882,214 | B2 | | 4/2005 | Spenea et al. |
| 6,917,317 | B2 | | 7/2005 | Nagaso et al. ............... 341/131 |
| 6,930,519 | B2 | | 8/2005 | Fallahi et al. ................ 327/115 |
| 6,930,917 | B2 | | 8/2005 | Novac et al. ........... 365/185.05 |
| 6,952,125 | B2 | | 10/2005 | Ahn et al. .................... 327/156 |
| 6,970,025 | B2 | | 11/2005 | Magoon et al. ............. 327/115 |
| 7,064,617 | B2 | | 6/2006 | Hein et al. |
| 7,288,998 | B2 | | 10/2007 | Thomsen et al. |
| 7,295,077 | B2 | | 11/2007 | Thomsen et al. |
| 2002/0075981 | A1 | | 6/2002 | Tang et al. |
| 2002/0140512 | A1 | | 10/2002 | Stockton ....................... 331/11 |
| 2002/0190764 | A1 | | 12/2002 | Nichols ...................... 327/115 |
| 2003/0201805 | A1 | * | 10/2003 | Holland et al. .............. 327/113 |
| 2004/0222856 | A1 | | 11/2004 | Hein ............................ 331/16 |
| 2004/0232997 | A1 | | 11/2004 | Hein et al. .................... 331/16 |
| 2004/0246809 | A1 | | 12/2004 | Sutardja ..................... 365/232 |
| 2005/0068118 | A1 | | 3/2005 | Hein .......................... 331/158 |
| 2005/0212570 | A1 | | 9/2005 | Sun et al. .................... 327/115 |
| 2005/0242848 | A1 | | 11/2005 | Sun et al. .................... 327/115 |
| 2007/0146083 | A1 | | 6/2007 | Hein et al. |

FOREIGN PATENT DOCUMENTS

| | | |
|---|---|---|
| EP | 0 393 975 A1 | 10/1990 |
| EP | 0 402 736 A2 | 12/1990 |
| EP | 0 601 780 A2 | 6/1994 |
| EP | 1 345 375 A2 | 9/2003 |
| JP | 02-291161 | 11/1990 |
| JP | 03-297223 | 12/1991 |
| WO | WO85/02966 | 7/1985 |

OTHER PUBLICATIONS

Pamarti, Sudhakar, et al., "A Wideband 2.4-GHz Delta-Sigma Fractional-$N$ PLL With 1-Mb/s In-Loop Modulation," IEEE Journal of Solid-State Circuits, vol. 39, No. 1, Jan. 2004, pp. 49-62.

Riley, Tom A. D., et al., "Delta-Sigma Modulation in Fractional-$N$ Frequency Synthesis," IEEE Journal of Solid-State Circuits, vol. 28, No. 5, May 1993, pp. 553-559.

U.S. Appl. No. 11/270,954, filed Nov. 10, 2005, Thomsen et al.

U.S. Appl. No. 11/270,957, filed Nov. 10, 2005, Thomsen et al.

Craninckx, Jan and Steyaert, Michiel S. J., "A 1.75-GHz/3-V Dual-Modulus Divide-by-128/129 Prescaler in 0.7-µm CMOS," IEEE Journal of Solid-State Circuits, vol. 31, No. 7, Jul. 1996, pp. 890-897.

Cypress Semiconductor Corporation, "Cypress 1 PLL In-System Programmable Clock Generator with Individual 16K EEPROM," Dec. 14, 2002, 18 pages.

Encinas, J. B., "Phase Locked Loops," Chapman & Hall, 1993, pp. 144-158.

Fox Electronics, "F6233 Quick Delivery Oscillator," 1 page (from file history of U.S. Patent 5,962,890).

Gardner, Floyd M., "Phaselock Techniques," Second Edition, John Wiley & Sons, 1979, pp. 2-5.

Gaskell, Tom, "Semiconductor Circuits Programmable Crystal Oscillator (PX0-600)," Practical Electronics, Jul. 1983, pp. 40-43.

Giles, T. G., "A Universal Frequency Synthesizer IC," Philips Telecommunication Review, vol. 37, No. 3, Aug. 1979, pp. 177-181.

Goto, Junichi, et al., "A Programmable Clock Generator With 50 to 350 MHz Lock Range For Video Signal Processors," IEEE 1993 Custom Integrated Circuits Conference, pp. 4.4.1-4.4.2.

IC Designs, "IC Designs Introduces Trio of Parts Aimed at Replacing Crystal Oscillators in Personal Computer Graphics Board Designs," News Release, May 9, 1990, 1 page.

IC Designs, "Dual Programmable Clock Oscillator," Model No. ICD2051, V2.0, May 1991, pp. 1-12.
IC Designs, "Dual Programmable ECL/TTL Clock Generator," Model No. ICD2062B, prior to 1995, 1 page.
IC Designs, "Dual VGA Clock Generator," Model No. ICD2042A, prior to 1995, 1 page.
IC Designs, "Frequency Multiplier," Model No. ICD2032 Preliminary Data Sheet, V2.0, May 1991, pp. 1-7.
IC Designs, "Graphics Frequency Synthesizers," Model No. ICD2061A, prior to 1995, 1 page.
IC Designs, "Programmable Clock Oscillator," Model No. ICD2053A Programmable Products, V1.0, prior to 1995, 14 pages.
IC Designs, "Programmable Graphics Clock Generator," Model No. ICD 2063, prior to 1995, 1 page.
IC Designs, "Satellite Oscillator," Model No. ICD2031A Preliminary Data Sheet, V2.0, May 1991, pp. 1-8.
Krishnapura, Nagendra and Kinget, Peter R., "A 5.3-GHz Programmable Divider for HiPerLAN in 0.25-μm CMOS," IEEE Journal of Solid-State Circuits, vol. 35, No. 7, Jul. 2000, pp. 1019-1024.
Lovelock, Peter A., "Build This Programmable Crystal-Controlled Pulse Generator," Radio Electronics, Jun. 1990, pp. 47-50.
M-Tron, "MT1135 Series Dual Band Rate Generators," 1987, 3 pages.
Perrott, Michael H., et al., "A 27-mW CMOS Fractional-N Synthesizer Using Digital Compensation for 2.5-MB/s GFSK Modulation," IEEE Journal of Solid-State Circuits, vol. 32, No. 12, Dec. 1997, pp. 2048-2060.
Sumi, Yasuaki, et al., "Novel Fractional-N PLL Frequency Synthesizer with Reduced Phase Error," Proceedings of IEEE Asia Pacific Conference on Circuits and Systems '96, Nov. 18-21, 1996, Seoul, Korea, pp. 45-48.
Epson, "Programmable Multi-Output Crystal Oscillator MG-5010," Mar. 7, 1993, 3 pages.
Foord, A., "Voltage Controlled Oscillator," Radio & Electronics Constructor, May 1975, pp. 590-595.
FOX Electronics, "1995-1996 Frequency Control Products Catalog," Fort Meyers, Flordia, 1995, 72 pages.
FOX Electronics, "F3000 / HCMOS/TTL Tri-State Enable/Disable Oscillator," 1992, 1 page.
FOX Electronics, "F6053A / Tri-State HCMOS Programmable Clock Oscillator," 1993, 4 pages.
FOX Electronics, "F6151 / Tri-State HCMOS Dual Programmable Clock Oscillator," 1993, 4 pages.
HYBRIDS International, Ltd., "Hybrids International Product Summary," Mar. 1993, Olathe, Kansas, 7 pages.
IC Designs, "Application Note: Power Feed and Board Layout Issues," May 1991, 3 pages.
IC Designs, Model No. ICD 6233, Specifications, Feb. 11, 1994, 32 pages.
MF Electronics Corp., "Crystal Controlled Oscillators 20 to 220 MHz Programmable ECL," prior to 1995, pp. 9, 11, 18-20.
Mielke, Erhard, "XP-002061415 Programmierbarer 50-MHz-Muttertaktimpulsgenerator," 2421 Radio Fernsehen Elektronik 39 (1990) No. 9, Berlin, 4 pages.
M-Tron, "MV Series VCXO Oscillators," prior to 1995, 1 page.
National Semiconductor, "PLL™ Low Power Frequency Synthesizer for RF Personal Communications," Advance Information, Jan. 1998, 18 pages.
Ooms, William J., "Improved Frequency Synthesizer," 8182 Motorol Technical Disclosure Bulletin, Oct. 1986, Schaumbourg, ILL, 3 pages.
Perrott, Michael H., "Techniques for High Data Rate Modulation and Low Power Operation of Fractional-N Frequency Synthesizers," Dissertation, Massachusetts Institute of Technology, Sep. 1997, pp. 1-199.
Philips Semiconductors, Product Specification Data Sheet, HEF4017B, MSI, 5-Stage Johnson Counter, Jan. 1995.
Soderquist, Donn, "Digitally Programmed Oscillator is Suitable for μP Control," Precision Monolithics Inc., (no date), 2 pages.
Vectron Laboratories, "Sonet Clock Recovery Module 622.08 MHz," Model No. SCRM-622, 1994, 4 pages.
Wenzel Associates, "Custom Oscillator Configurations," Austin, Texas, 1 page.
De Muer, Bram and Steyaert, Michiel, "CMOS Fractional-N Synthesizers, Design for High Spectral Purity and Monolithic Integration," Kluwer Academic Publishers, Boston, pp. 58-83, 2003.
Non-Final Office Action in U.S. Appl. No. 11/270,954, mailed May 9, 2007, 28 pages.
Non-Final Office Action in U.S. Appl. No. 11/270,957, mailed Apr. 30, 2007, 18 pages.

* cited by examiner

DUAL LOOP ARCHITECTURE USEFUL FOR A PROGRAMMABLE CLOCK SOURCE AND CLOCK MULTIPLIER APPLICATIONS

This application is a continuation-in-part of application Ser. No. 10/675,543, now U.S. Pat. No. 7,187,241 B2, entitled "CALIBRATION OF OSCILLATOR DEVICES", filed Sep. 30, 2003, naming Jerrell Hein and Axel Thomsen as inventors, which claimed benefit under 35 U.S.C. § 119(e) of application 60/467,813, filed May 2, 2003; and this application claims benefit under 35 U.S.C. 119(e) of application 60/567,479, entitled "METHOD AND APPARATUS FOR A PROGRAMMABLE CLOCK SOURCE GENERATING A WIDE RANGE OF OUTPUT FREQUENCIES", filed May 3, 2004, naming Axel Thomsen, Yunteng Huang, Jerrell P. Hein as inventors, which applications are incorporated herein by reference.

BACKGROUND

1. Field of the Invention

This application relates to integrated circuit devices more particularly to integrated circuits utilized in generating clock signals.

2. Description of the Related Art

Clock sources typically utilize a resonator such as a crystal oscillator or surface acoustic wave (SAW) device. Precision in traditional clock sources utilizing crystal oscillators is determined by the accuracy of the cut of the crystal and the calibration performed after the cut. For example, frequency tuning may be achieved by sputtering gold after cutting the crystal. Fixed frequency sources such as crystals have typically provided better phase noise performance than the phase noise performance associated with variable frequency source such as, e.g., a voltage controlled oscillator (VCO). That is due, at least in part, to the fact that the variable elements (e.g. the varactor) associated with the VCO used to vary the frequency have higher losses than fixed elements such as the capacitors in a fixed source.

However, resonators typically have a limited optimum range due to manufacturing constraints. That is, it is hard to pull a crystal over a wide range. However, various applications have requirements for numerous frequencies outside the easy range for a resonator. Typically, a different frequency range will require a different resonator. Accuracy requirements vary for clock sources, but are typically in the parts per million (ppm) range.

In another aspect, clock signals are used by transmission systems to synchronize the flow of data. Such clock signals, particularly high speed clock signals, may include jitter, which should be managed to prevent bit errors. Jitter is the variation in clock output frequency from a desired output frequency and can occur for a number of reasons. Jitter may be caused by noise introduced into the system from any of a variety of sources including jitter present on a reference clock utilized in generating the high speed clock signals. It would be desirable to provide improved techniques for supplying high speed clock signals.

It would also be desirable to provide a clock source that meets accuracy requirements, allows the use of a resonator that is easy to manufacture and low cost, but can still provide a wide range of output frequencies and suitable phase noise performance.

SUMMARY

In one embodiment, an apparatus is provided that includes a first phase-locked loop (PLL) circuit that has an input for receiving a timing reference signal, a controllable oscillator circuit supplying an oscillator output signal, and a multi-modulus feedback divider circuit. A second control loop circuit is selectably coupled to supply a control value to the multi-modulus feedback divider circuit of the first loop circuit to thereby control the oscillator output signal. The control value supplied may be a digital control value. In an embodiment, while the second control loop is coupled to supply the control value to the feedback divider circuit, the control value is determined according to a detected difference between the oscillator output signal and a reference signal coupled to the second control loop circuit. In an embodiment, a temperature compensation circuit is coupled to supply an adjustment value according to a detected temperature, and the control value supplied to the multi-modulus feedback divider circuit is adjusted according to the adjustment value, while the second control loop is not coupled to supply the control value to the feedback divider circuit. The apparatus may further include a voltage control input, and the control value supplied to the multi-modulus feedback divider circuit is adjusted according to a voltage value present on the voltage control input. The apparatus may further include one of a crystal oscillator and a surface acoustic wave (SAW) resonator supplying the timing reference signal. The second control loop circuit may be implemented as a phase-locked loop and include a digital loop filter. The apparatus may further include a nonvolatile storage; and while the second control loop circuit is not coupled to control the first PLL circuit, the first PLL circuit receives a digital control value to control a divide ratio of the feedback divider, the digital control value being determined at least in part according to a stored control value stored in the nonvolatile storage, the stored control value corresponding to a desired frequency of the oscillator output signal. The stored control value in the non-volatile storage may be based on a digital control value that was stored as a result of the second control loop circuit detecting a lock condition indicating that the oscillator output signal was locked to a reference signal coupled to the second control loop circuit. In an embodiment the second control loop is implemented as a low bandwidth phase-locked loop and a bandwidth of the first PLL circuit is substantially higher than the low bandwidth of the second control loop circuit.

In another embodiment, a method is provided that includes selectably coupling an outer loop circuit to control an inner loop circuit; and controlling the inner loop circuit by supplying a control value from the outer loop circuit to control a divide ratio of a feedback divider of the inner loop circuit, while the outer loop is coupled to control the inner loop, to cause the inner loop to generate an output signal based on a reference clock signal supplied to the outer loop circuit. The method may further include supplying the inner loop with a timing reference signal from one of a crystal oscillator and a surface acoustic wave (SAW) device as an input into the inner loop circuit. In an embodiment, the inner loop circuit is a fractional N loop such that a period of the timing reference signal can be a non-integer multiple of a period of an output signal generated by the inner loop circuit. In an embodiment, the inner loop circuit and outer loop circuit are phase-locked loops and the outer loop is a low bandwidth phase-locked loop and the inner loop is a phase-locked loop having a substantially higher bandwidth than the low bandwidth of the outer loop circuit. The method may further include supplying a stream of integers from a delta sigma modulator corresponding to the control value to control the divide ratio of the feedback divider. The method may further include, while the outer loop is not coupled to control the inner loop circuit, supplying the inner loop circuit with a digital control signal as the control value to control the divide ratio, the control value being determined at least in part according to a stored control value stored in a nonvolatile storage, the stored control value corresponding to a desired output frequency of the inner loop circuit. The method may further include determining the digital control value supplied to the inner loop circuit to control the divide ratio at least in part according to a detected temperature. The method may further include determining the digital control value supplied to the inner loop circuit to control the divide ratio at least in part according to a control voltage supplied on a voltage control input terminal to adjust output frequency of the inner loop circuit. The method may further include storing a control signal corresponding to the divide ratio supplied to the inner loop to cause the inner loop to generate the output signal having a frequency corresponding to the reference clock, in response to a lock condition detected by the outer loop circuit. The method may further include selecting a source for the control value from one of the outer loop circuit or from a nonvolatile storage storing a stored control value corresponding to desired frequency of the oscillator output signal.

In another embodiment an apparatus is provided that includes a fractional N inner loop circuit including, an input for receiving a timing reference signal, a feedback divider circuit, and a controllable oscillator circuit. An outer loop circuit is coupled to compare a feedback signal coupled to an output of the oscillator circuit and a reference signal coupled to an input of the outer loop circuit, and generates an error signal indicative of the comparison. The outer loop is coupled to supply a divider control signal to control a divide ratio of the feedback divider circuit, the divider control signal being determined at least in part according to the error signal generated by the outer loop circuit.

In another embodiment, a method is provided for receiving a first reference signal as an input to a fractional-N phase-locked loop circuit (PLL), generating an error signal in a second phase-locked loop indicative of a difference between a feedback signal coupled to an output of the fractional-N PLL and a second reference signal coupled to an input of the second phase-locked loop, and supplying a control signal, based at least in part on the error signal, to control a divider circuit in a feedback path of the inner loop circuit.

In another embodiment, an integrated circuit is provided that includes a first phase-locked loop (PLL) circuit including an input for receiving a timing reference signal, a controllable oscillator circuit supplying an oscillator output signal, and a feedback divider circuit. A second control loop circuit supplies a control value to the feedback divider circuit to thereby control the oscillator output signal.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 1:
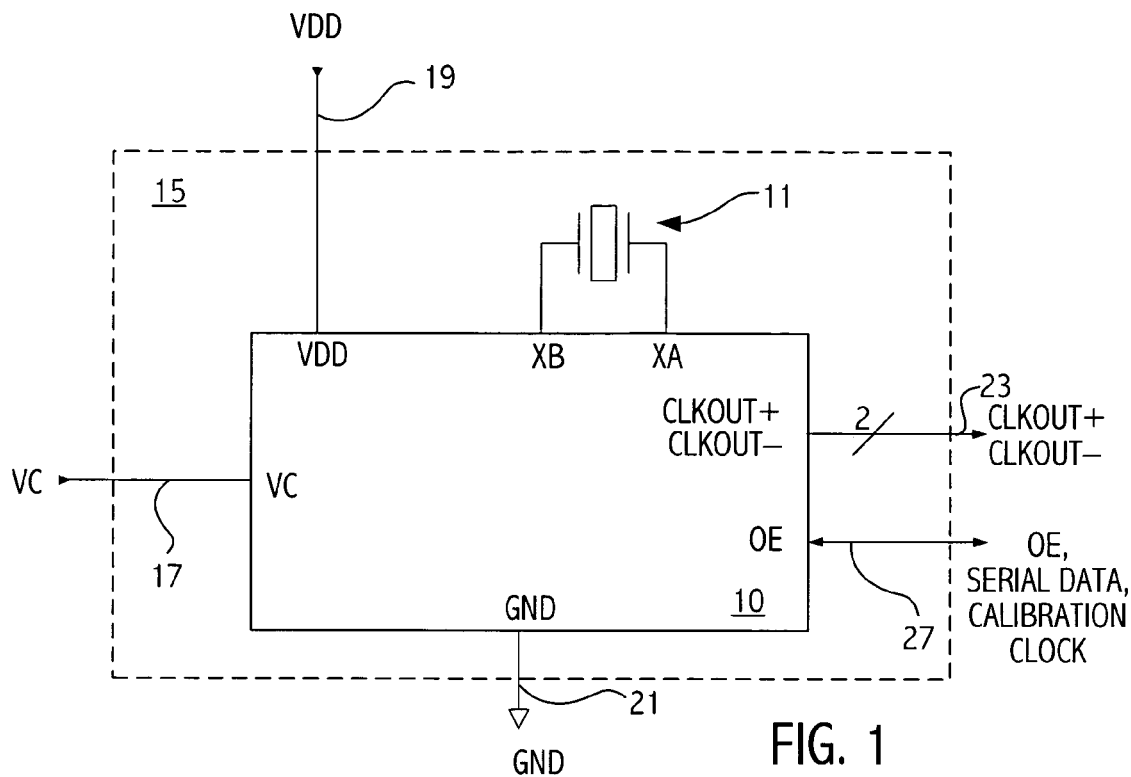
FIG. 1 illustrates a device in which an integrated circuit and a crystal are packaged in a standard six pin VCXO ceramic package.
Figure 2:
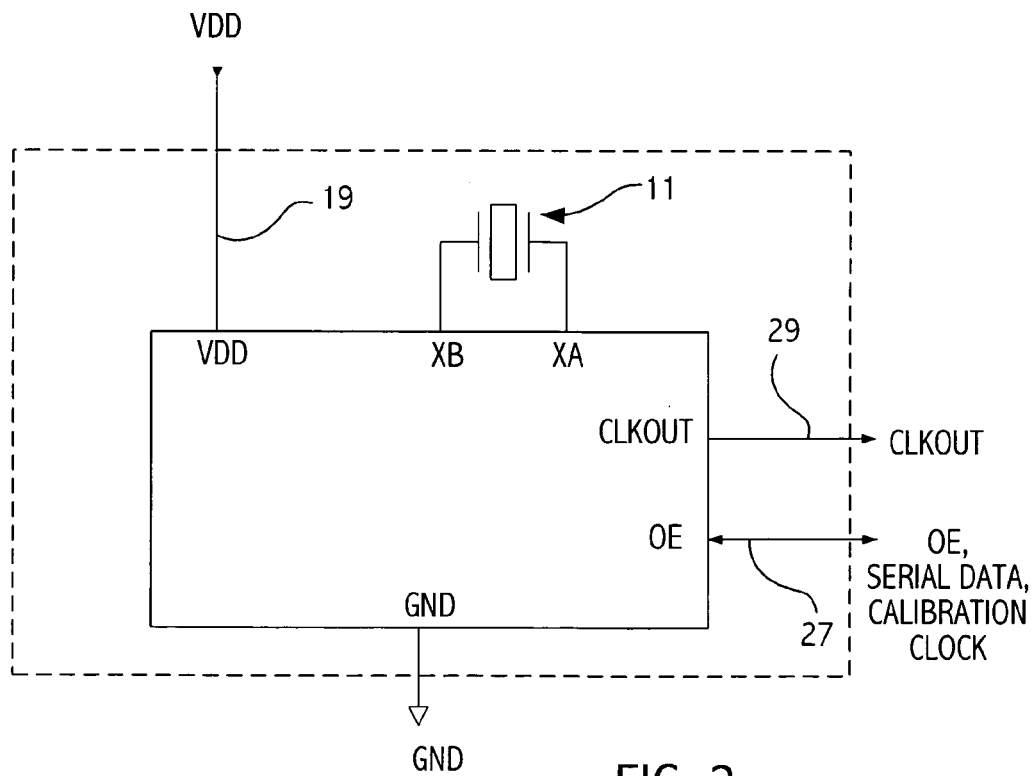
FIG. 2 illustrates a device in which an integrated circuit and a crystal are packaged in a standard four pin XO ceramic package.

Referring to FIG. 1, a high level diagram shows a clock source device that includes an integrated circuit 10 coupled to a crystal 11. In one embodiment both the integrated circuit 10 and the crystal 11 are packaged in a standard ceramic package 15 that is typically utilized for packaging a voltage controlled crystal oscillator (VCXO). Note that another resonating device such as a surface acoustic wave (SAW) resonator may be utilized in place of crystal 11. In the illustrated embodiment, the package 15 includes standard input/output signals including a voltage control input 17, a power and ground input, 19 and 21 respectively, differential clock outputs and an output enable (OE) pin 27. FIG. 2 illustrates a four pin XO package implementation in which the control voltage input 17 is not utilized and the output clock 29 is single ended. A six pin XO package configuration may also be utilized in which the control voltage input on the package is not connected when the package 15 is mounted to a board. Other packaging alternatives for the integrated circuit with or without the crystal oscillator or SAW may also be utilized.

Figure 3:
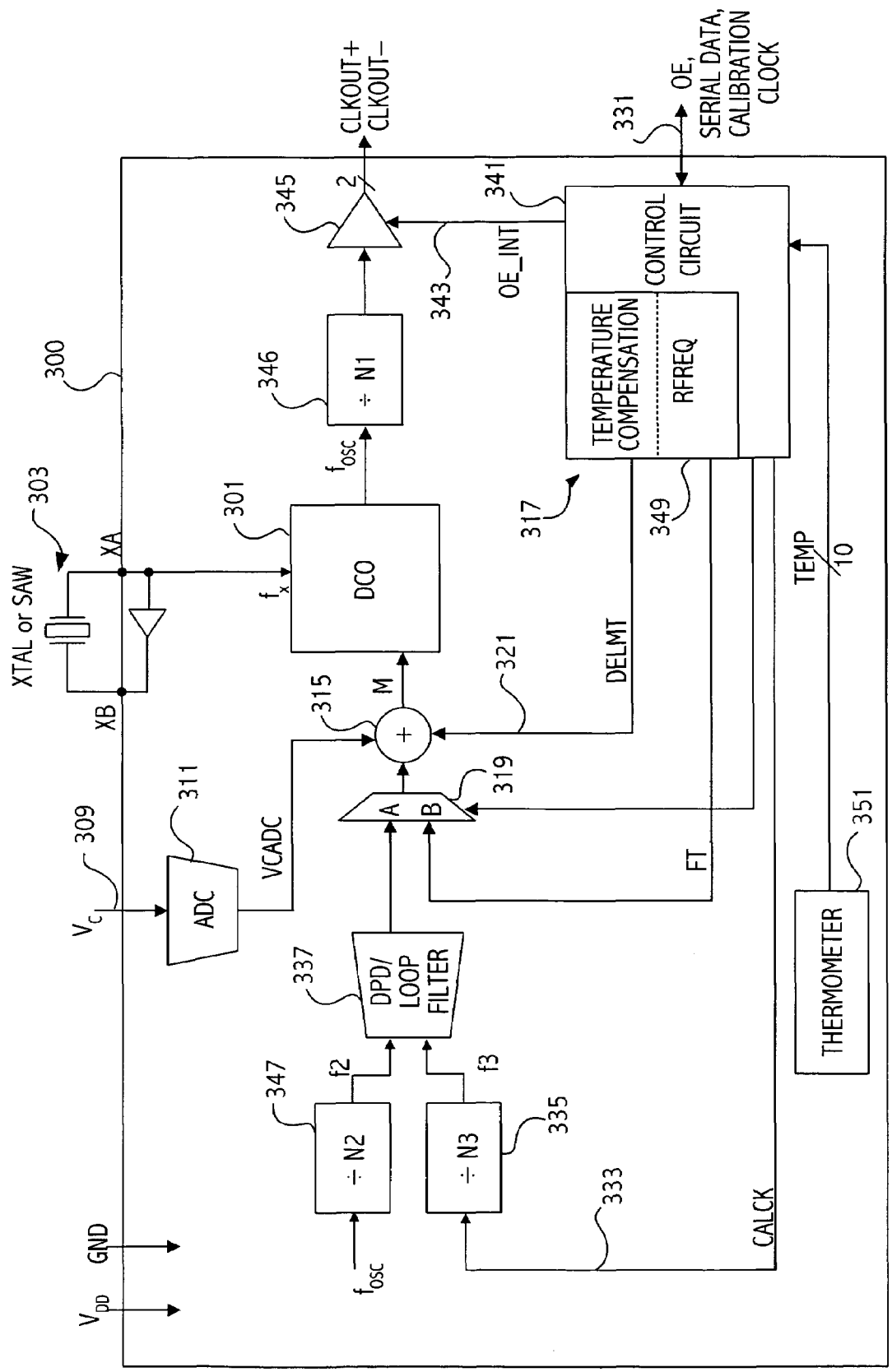
FIG. 3 illustrates a block diagram of an exemplary integrated circuit suitable for use as the integrated circuit in FIGS. 1 or 2.

Referring to FIG. 3, a block diagram illustrates an embodiment of integrated circuit 10 that provides a fixed frequency or voltage controlled clock source. In FIG. 3, the integrated circuit is packaged in a six pin VCXO package. Integrated circuit 300 includes a digitally controlled oscillator (DCO) 301. With the use of a fractional N phase-locked loop (PLL), a crystal based reference clock 303 can be multiplied up by a rational number to supply a wide variety of output frequencies. The fractional N loop can be viewed as a digitally controlled oscillator, where the output frequency is controlled by the rational digital number M according to Fout=M×Fref. Thus, the DCO 301 can be implemented as a fractional N PLL providing a wide range of output frequencies $f_{osc}=M \times f_x$, where $f_x$ is supplied from oscillator 303. The precision of M can be to the level of a few parts per billion. An important criteria is to ensure that a DCO, such as illustrated in FIG. 3, meets the phase noise specifications typically achieved by a fixed frequency crystal or SAW based oscillator. A standard of interest would be for example the SONET standard for jitter generation. That will be explained in more detail below.

Fractional N phase-locked loops (PLLs) allow the multiplication of an incoming reference clock by a rational rather than an integer number as is common in traditional PLL designs. Such a multiplication requires the use of a multimodulus divider in the feedback path. Such a divider will divide not by a fixed integer, but by a sequence of integers that over time approximates the rational number desired. This sequence can be generated by a digital delta sigma modulator which shapes the quantization noise added to the rational number with a high pass filter. Thus the resulting phase noise is also shaped by a high pass filter. The overall noise contribution from the fractional PLL depends on two major factors. The first major factor is the ratio of the update rate of the PLL (generally the reference clock rate) and the loop bandwidth of the PLL, a measure similar to the oversampling ratio (OSR) in delta sigma analog to digital converters (ADCs). A higher OSR allows for better suppression of quantization noise in the band of interest. For a given update rate the noise contribution can be reduced by lowering the loop bandwidth. The second major factor contributing to noise is the quantization error applied at the divider, which is the clock period of the clock feeding the multi-modulus divider.

Additional to the noise sources stated above, noise in a PLL has 2 other main contributors: The first other main contributor is noise from the voltage controlled oscillator (VCO). An integrated LC VCO exhibits 3 noise regions, close in $1/f^3$, intermediate $1/f^2$, and high frequency white noise that is frequency independent. For example, exemplary corners defining the three regions are at 100 KHz and 100 MHz. For an integrated LC VCO oscillating in the GHz range, the $1/f^3$ region is significant, whereas the white noise region is insignificant. When embedded in a PLL the noise transfer function to the output of the PLL is a high pass filter with a corner at the loop bandwidth. Wider loop bandwidth improves the noise contribution from the VCO. If the bandwidth of the loop exceeds the 1/f corner of the oscillator, the overall phase noise performance tends to be very competitive with the performance of prior art fixed frequency crystal or SAW based oscillators in applications such as SONET.

The second other main contributor to noise in a PLL is noise from the reference clock. Similar noise regions exist as above. If this clock is generated from a fixed crystal oscillator, it is generally very competitive at low frequency ($1/f^3$ and $1/f^2$) but with a significant white noise contribution. Narrower loop bandwidth improves the noise contribution of this source.

The choice of loop bandwidth is an optimization to reduce noise from various sources. Given today's state of the art in LC oscillator design in terms of phase noise and oscillation frequency, and the ability of a state of the art CMOS process to implement a high speed multi-modulus divider and a high speed delta sigma modulator, it is now possible to optimize the noise budget to yield a clock source that can exceed standards such as SONET and to enable this architecture as a clock source.

Good jitter performance of the DCO loop is facilitated by implementation of the loop filter as a digital filter, which is a technique that allows an accurate implementation of the loop filter that is properly matched to the corners and the order of the noise shaping function and therefore can best reduce the jitter contribution from that source. Digital loop filter implementations are known in the art and described, e.g., in U.S. Pat. No. 6,630,868, entitled "Digitally Synthesized Loop Filter Circuit Particularly Useful for a Phase Locked Loop", published as Published Application Number 20020089356 A1, Jul. 11, 2002, naming Perrott et al. as inventors, which are incorporated herein by reference.

Additionally, the current phase error can be computed as the integral of all instantaneous frequency errors as they were computed in the delta sigma modulator that controls the multi modulus divider. Through subtraction in the analog or digital domain, the phase error can be cancelled and thus strongly reduced as a noise source. As a result the bandwidth can be increased and thus overall better jitter performance can be achieved.

The device illustrated in FIG. 3 can function as a voltage-controlled crystal oscillator (VCXO/VCSO) or as a fixed-frequency clock source (XO/SO). A register bit setting may be used to select between the modes of operation. In voltage-controlled oscillator operational mode a control voltage is received on the VC analog voltage input port 309. The on-chip analog to digital converter (ADC) 311 converts the control voltage VC into a digital control word (VCADC) supplied to summing circuit 315, which generates the control signal M for the DCO 301. When operating in VCXO/VCSO mode, the selector circuit 319 selects input B, which is coupled to the reference frequency (RFREQ) control value stored in a portion 349 of non-volatile storage 317. The control value from the selector circuit may be summed in summing circuit 315 with a temperature compensation value (DELMT) supplied on node 321 as described further herein, as well as with the control VCADC, and the sum is supplied to DCO 301 as the control signal to determine the DCO output. In VCXO/VCSO mode the RFREQ provides a center frequency that is adjusted by VCADC. If temperature compensation is not used, a value for DELMT is selected so as to not effect the output of DCO 301. Note that while 315 is shown in the block diagram as a summing circuit, some embodiments may utilize other arithmetic circuits to appropriately combine the various control values that are used to form the control signal M for DCO 301. For example in one embodiment, the signals are combined using a multiplier circuit in which the center frequency provided by RFREQ is scaled appropriately by VCADC and/or DELMT using a multiplier circuit.

When operating as a fixed frequency clock source, the selector circuit 319 also selects input B, to supply the reference frequency (RFREQ) control value stored in a portion 349 of non-volatile storage 317. That control value may be summed in summing circuit 315 with a temperature compensation value (DELMT) supplied on node 321. The sum from summing circuit 315 is supplied to DCO 301 as the control signal to determine the DCO output. When operating as a fixed-frequency clock source (XO/SO), the ADC 311 may be powered down and its output fixed to its mid-scale value so as not to affect the DCO 301.

The use of a DCO as a clock source has several advantages. Digital control of the output frequency allows for storage of calibration parameters in non-volatile memory 317. Also, the DCO can be embedded in an outer phase locked loop as described further herein. This outer loop includes a phase detector with digital output and a digital loop filter 337 and the DCO 301. When the outer loop is in lock to a reference frequency, the value present at the input to the DCO 301 is the proper multiplier to achieve this frequency in an open loop operation. Therefore this value can be stored while in lock and recalled later for operation in open loop as a clock source. The loop bandwidth of the inner loop, as described above, is preferably greater than the 1/f corner. Depending on specific implementations, the loop bandwidth of the inner loop may range from approximately 10 KHz to approximately 10 MHz. The loop bandwidth of the outer loop is preferably substantially lower, e.g., below approximately 1 KHz and may be less than or equal to 50 Hz. Note also that the inner loop is implemented to adjust quickly to changes as compared with the outer loop. Having a low outer loop bandwidth allows attenuation of jitter present on the reference clock input to the outer loop, which in turn can reduce jitter present in a stored control value to control the output of the inner loop.

The embodiment illustrated in FIG. 3 has the capability of generating and storing a digital control value for DCO 301 corresponding to a calibration clock signal received via a calibration input. As discussed, above, when the outer loop is in lock to a reference frequency used for calibration, the value present at the input to the DCO 301 is the proper multiplier to achieve this frequency in an open loop operation. Therefore this value can be stored while in lock and recalled later for operation in open loop as a clock source. In that way, the device can be programmed to provide a clock having a desired output frequency. When operating in calibration mode, as described further herein, a calibration clock signal is supplied, e.g., on terminal 331 and via signal line 333 to divider 335. The calibration clock is compared to the output of the DCO 301 in phase and frequency detector 337 and an error signal is generated and filtered and supplied to adjust the output of DCO 301. When the output of the DCO has locked to the supplied calibration clock, the value of M may be stored. The calibration clock feature is useful, e.g., so that the device can lock its output clock to the calibration clock using an internal PLL, and control factors used to lock the PLL to the calibration clock can be stored for absolute output frequency and/or frequency versus temperature, as described further below. That stored value may then be utilized to control the DCO during normal operation.

Figure 4:
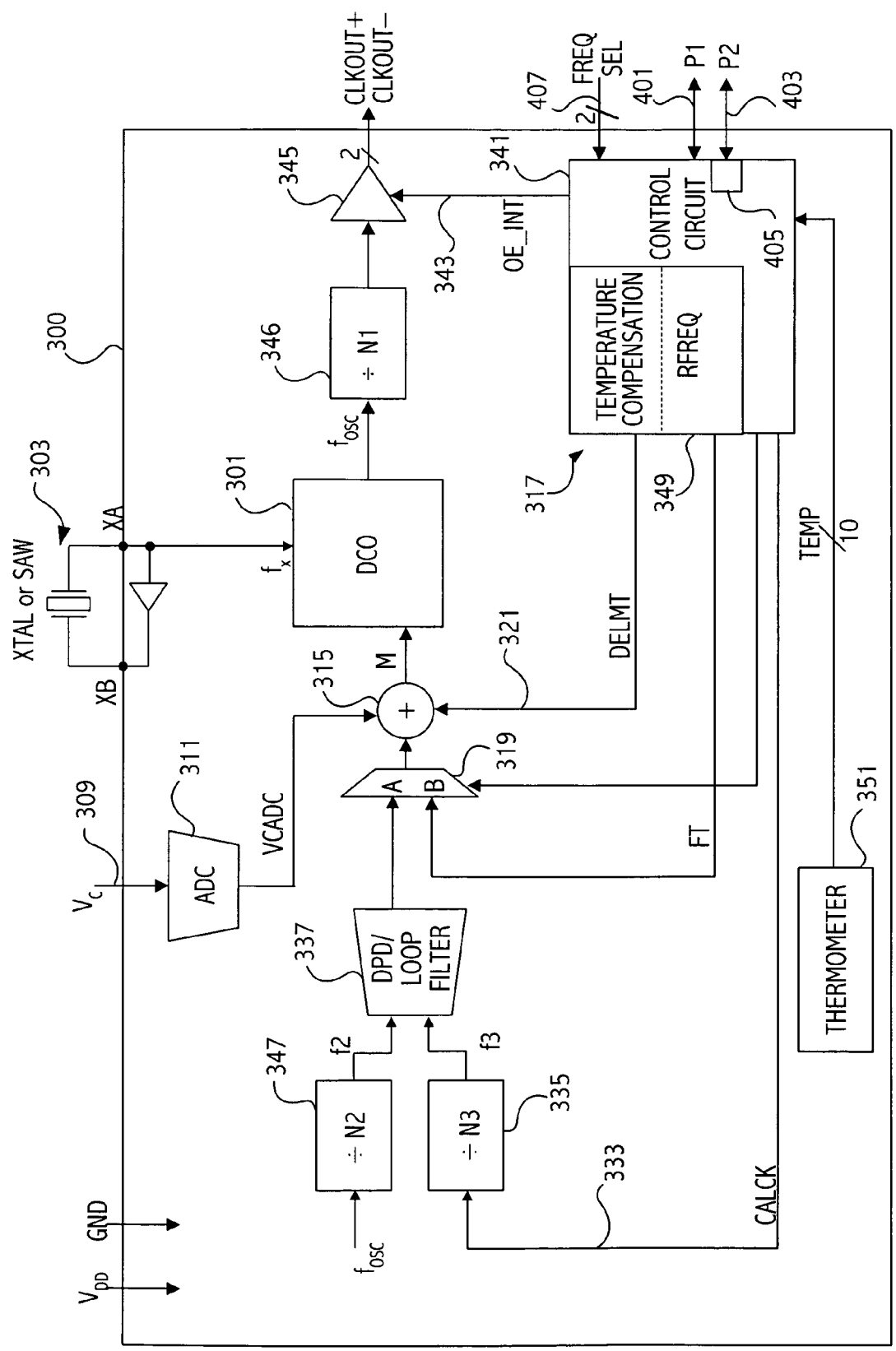
FIG. 4 illustrates alternative serial communication terminals for programming and for receiving a configuration clock according to an embodiment of the invention.

In order to supply the calibration clock and perform necessary programming associated with configuring the clock source, a communication port, e.g. a serial port may be provided. The serial port may be provided as a dedicated programming port or its function can be combined with other I/O terminals. For example, in one embodiment, the OE pin 331 functions as a normal output enable and for programming and calibrating the device 300. In order to program the integrated circuit device, the OE terminal 331 is used to communicate serial data to and from the integrated circuit 300 and used to supply a calibration clock. FIG. 3 shows an embodiment where the OE pin is also used as the communications port. Referring to FIG. 4, in another embodiment the option is provided for using one of two dedicated I/Os on the integrated circuit device. The P1 port 401 is a dedicated I/O that functions as a bidirectional serial port for register data reads and writes, and as a calibration clock input, similar to the function of the OE pin used for programming and calibration described above but without any OE pin functionality. The P2 port 403 is also a dedicated I/O with the same serial bus and calibration clock functionality as P1; however, once programming is completed, P2 can be converted from a dedicated serial port I/O to an input control for the output enable function. In still other embodiments, the voltage control input 309 may be used as a serial communications port. In order to distinguish between calibration clocks and serial data, a serial data command may be utilized that indicates to the device that the calibration clock will be applied next. That command enables the calibration PLL. After this command, the user supplies a calibration clock to the appropriate terminal providing the serial port. The frequency of the calibration clock may be low even though the output frequencies are high due to the use of the divider 347 in the feedback path from the oscillator 301. Additional details on implementation of the serial port may be found in application Ser. No. 10/675,543, entitled "CALIBRATION OF OSCILLATOR DEVICES", filed Sep. 30, 2003.

Figure 5:
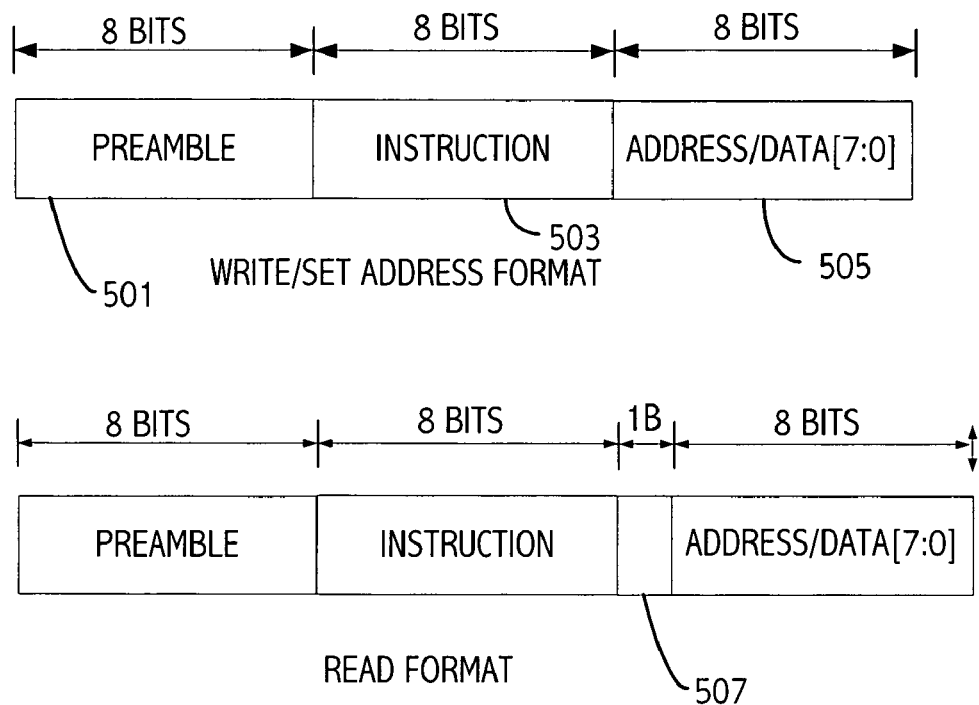
FIG. 5 illustrates exemplary read and write formats utilized for communicating over a serial port.

The serial port is typically used during manufacture test to establish the desired device configuration in the on-chip non-volatile memory (NVM) 317. Serial port communications can begin following a power-on-reset of the device. An exemplary command format for the serial bus is shown in FIG. 5. Each transmission has three eight bit bytes of data: the preamble byte 501, the instruction byte 503, and the address/data byte 505. One extra clock cycle 507 exists for the Read command in order to allow time for placing the transmit output of the test equipment hooked up to the device in high impedance before the first read bit is sent by the device. The serial port state machine, returns to its initialized condition if any invalid input data is detected or if no activity occurs on the bus. That feature allows the state machine to be brought to a known condition before signaling begins. In one embodiment, all data sent from the test equipment (master) to the device (slave) is Manchester encoded with a symbol rate of approximately 10 kbps. The Manchester encoding creates guaranteed transitions in the data pattern that are used by the device to determine the master's transmission rate. In an embodiment, read data sent from the device to the test equipment is in a non-return to zero (NRZ) format, which maximizes the available sampling time for the test equipment master. The test equipment master can sample the read data using the same internal clock used to generate the transmit data.

Figure 6:
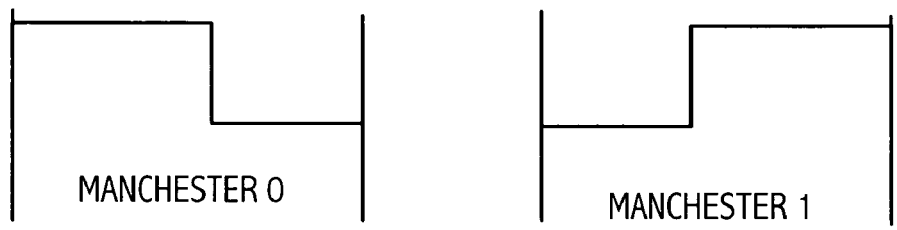
FIG. 6 illustrates exemplary use of Manchester encoding for data supplied over the serial port.
Figure 6:
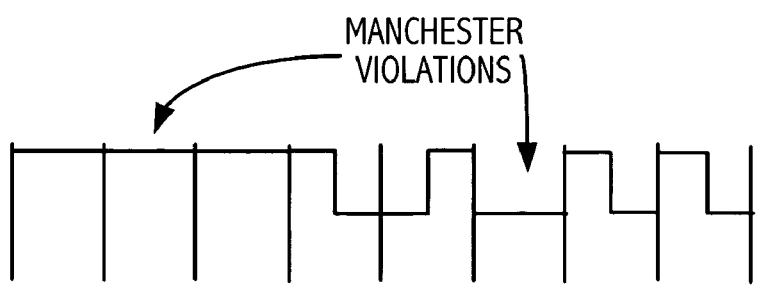

FIG. 6 gives illustrates a Manchester encoded "0" and "1" and also shows the required preamble data pattern. Note that the preamble contains multiple Manchester code violations in order to increase its uniqueness and reduce the chances of false preamble detection.

Referring again to the embodiment illustrated in FIG. 3, the digitally-controlled oscillator (DCO) 301 is driven by a digital frequency control word M and produces a low jitter output clock. The control word M supplied to the DCO 301 is generated by summing (or multiplying as mentioned above) a reference frequency control word (RFREQ) with the VCO ADC 311 output (VCADC), if utilized, and the temperature compensation value (DELMT), if utilized in summer 315. The fixed frequency external crystal 303, SAW, or other source, provides a low jitter reference needed to synthesize the output clock. In one embodiment frequency synthesis is done digitally, eliminating sensitive noise entry points.

In one embodiment, the method for frequency and temperature calibration of the DCO uses an external calibration clock applied at the serial port. In calibration mode, a digital phase locked loop (PLL) is implemented around the DCO, locking the DCO output clock to an integer multiple of the low frequency input calibration clock. Once the calibration clock is applied, the device internally generates the required calibration correction factors to generate the desired output frequency.

With reference to FIGS. 3 and 4, calibration according to an embodiment of the invention operates as follows. First the temperature compensation DELMT (delta M over temperature) is turned off. That forces its contribution to summing circuit 315 to 0. If desired it may be enabled after the calibration is complete. If the device is being used as a VCO, VCO mode should be enabled and the analog input $V_C$ 309 should be set to its mid-scale voltage during the calibration. That sets the analog to digital converter 311 at midrange. If the device is being used as a fixed frequency oscillator, VCO mode should be disabled to cause the output of the ADC 311 to be at midscale and thus not affect the output frequency. Next the calibration clock frequency range should be selected by selecting the N3 divider value for divider 335. In one embodiment, there are two possible frequency ranges for the calibration clock. A register bit can be used to select the range from 1 to 2 MHz, (the divider value=1). To select the range from 8 to 16 MHz, the input divider N3 is set to a divider value to 8. The choice of calibration clock frequency range is based on the availability of precision clock sources in the manufacturing test environment. Other embodiments may have different values for the divider block N3 or lack the divider block entirely.

The values for dividers 335 (N3), 347 (N2), and 346 (N1), and the high speed divider (HS_DIV)(see FIG. 8) should be selected along with the calibration clock frequency. The equation relating the calibration clock frequency to the output frequency is as follows for one embodiment of the invention.:

$$f_{OUT} = f_{CALCK} \times N2/(HS\_DIV \times N1) \text{(for } N3=1\text{), or}$$

$$f_{OUT} = f_{CALCK} \times N2/(8 \times HS\_DIV \times N1) \text{(for } N3=8\text{),}$$

where HS_DIV=[4, 5, 6, 7, 9, 11], $1 \leq N1 \leq 2^7$ and N2=256, 512, 1024

Other embodiments may provide other divider values, additional or fewer dividers and thus have different equations for determining the output frequency.

In some embodiments, the calibration loop bandwidth is also selectable. In one embodiment two choices for calibration loop bandwidth are available, which are selected according to a register bit. The wider bandwidth provides faster settling time, but allows more of the calibration clock phase noise to affect the absolute frequency accuracy when the DCO control is frozen. The lower bandwidth has slower settling, but less variation in the absolute frequency value when the DCO control is frozen. The optimal choice is a function of the calibration clock jitter and the absolute frequency accuracy requirement for the application.

Figure 7:
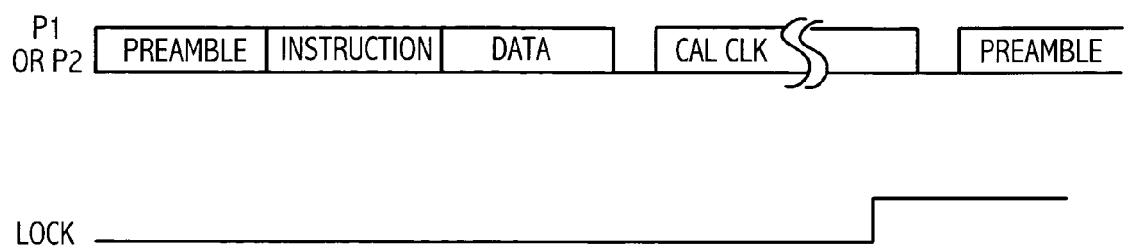
FIG. 7 illustrates exemplary use of a calibration clock over the serial port.

Referring to FIG. 7, and FIGS. 3 and 4, the control circuit 341 then receives a command setting the calibration clock on (CCK_ON) register bit to one through a serial port register write, indicating that a calibration clock is to be supplied over the serial port (input/output terminal 27, P1, or P2). Subsequently, the calibration clock can be supplied as an input frequency reference for the calibration PLL. FIG. 7 illustrates a command sequence including a preamble, write command and data followed by application of the calibration clock. In response to the write command, the control state machine selects multiplexer input A from the digital phase detector and loop filter 337, which forms a phase-locked loop with DCO 301 in this configuration. The calibration clock (CALCK) is supplied via node 333 to the divider circuit 335. The digital phase detector and loop filter 337 detects the phase/frequency difference between the calibration clock and the output of the DCO 301 and provides a correction signal to summer 315 through multiplexer 319 to adjust the control signal M supplied to the DCO 301 to reflect that difference. The calibration clock is applied for sufficient amount of time to allow the PLL to settle and establish the control factors needed to lock the DCO 301 output clock to an integer multiple of the low frequency input calibration clock. In other embodiments the DCO may lock to a fractional multiple (e.g., a ratio of integers) of the calibration clock according to the dividers utilized. Note that because of the divider 347 in the feedback path of the PLL, the calibration clock can be a low frequency signal even for those devices with high speed output clocks.

Note that control operations associated with calibration, e.g., selecting the multiplexer input and storing the value of M, may be controlled via commands sent to serial port, the result of internal control generated by, e.g., a state machine in control circuit 341, or both.

Once the PLL is locked and settled the calibration clock is stopped as shown in FIG. 7. That causes the internal state of the device to be stored and the CCK_ON bit is automatically reset to zero. The cessation of the clock is detected by the control circuit 341 causing it to freeze the correction or control values internally. If the delay required to detect the cessation of the clock allows the PLL to be disturbed before the control values are stored, a history of the control values can be kept on-chip and the control values that existed before the actual clock cessation can be kept. The values that are stored may be the correction factor generated by the phase detector and loop filter 337 or the value of M when the PLL is locked to the calibration clock (essentially the same as the correction factor but after the summing circuit 315). To avoid any inaccuracies in the frozen register values due to the loss of clock detection delay, a running history of the values is kept and the values that existed immediately before the loss of clock are stored when the PLL is frozen. The running history may be stored in registers in the control circuit 341. The control value(s), along with appropriate divider values, can be stored in the non-volatile memory 317, which may, e.g., be implemented as an EPROM, EEPROM, or any other suitable non-volatile memory. The stored control value is used to generate the control value supplied to the DCO 301 by supplying the control value to summing node 315 during normal operation.

In one embodiment a lock detection mechanism is included for the calibration PLL. A lock detect bit (LOCK) is the result of an analysis of the PLL phase detector output. A retriggerable one-shot is set each time the phase detector output indicates a full-scale condition (phase cycle slip). The retrigger time of the one-shot may be programmable via a register bit. Therefore, if no cycle slip has occurred for the retrigger time, the internal lock detection indicator bit (LOCK) is set to one, indicating that the PLL is in lock. The internal lock detection indicator bit (LOCK) can be queried to verify that the PLL achieved lock during the time the calibration clock was active.

Once the calibration clock has ceased for a sufficient amount of time defined by a predetermined time period, the internal over sampling state machine returns to its reset or initialization state, waiting for further activity on OE, P1 or P2, and ready to receive additional commands. This timeout feature prevents lockup of the state machine, guaranteeing a known starting condition for the user.

Note that the serial communication capability available through input/output terminal 331 also allows a user to program a fixed control value to set oscillator 301 to a specific output frequency by writing to reference frequency storage location 349, supplying that value to the multiplexer 319 and selecting the B input of the multiplexer 319 to be supplied to the summing circuit 315. Additionally, in some embodiments, the divider ratios in some or all of divider blocks may be written and/or read via the serial port provided by input/output terminal.

Note that calibration can also be performed without a calibration clock input. However, that requires multiple serial data writes to the device to set the digital control value supplied, e.g., through summing circuit 315 so that while the control voltage Vc is centered, the clock out signal matches the desired output clock frequency. By instead using a calibration clock supplied over the serial port, the device can itself find the desired correction value by locking its PLL to the calibration clock.

The on-chip nonvolatile memory (NVM) 317 provides for permanent storage of device configuration settings and calibration settings at manufacture. The NVM memory space includes bits for all of the settings necessary to fully configure the device. The volatile memory space includes duplicate bits for each NVM bit, plus additional bits that do not require nonvolatile storage. In one embodiment, the non-volatile memory is one time programmable. A primary (M1) and secondary (M2) NVM space may be provided to allow the NVM settings to be written twice during the lifetime of the device. A status register may be used to indicate the current status of M1 and M2. Data is written from volatile memory, such as registers, into NVM using the STORE command. All volatile memory bits with duplicates in the NVM space are written with one command. The first time the STORE command is executed, the M1 NVM space is written. When the write is initiated, a status bit (M1_WR) is permanently set. Once the write is completed, STORE is reset to zero, a read of M1 is done, and the result is compared to the volatile memory settings. If there is a match, then the NVM write has been successful and the M1_CHK status bit is permanently set. The next time the STORE command is executed, the M2 NVM space will be written. After device powerup or reset, the NVM status bits are checked and the appropriate NVM memory space downloaded into the volatile memory. The appropriate NVM space may also be downloaded on command using the RECALL register bit. Once the download is complete, RECALL is reset automatically.

Upon power up, the device internally executes a power on-reset (POR) which resets the internal device logic, loads the various settings stored in the non-volatile memory into volatile memory (e.g. the various control registers), and places the device output into high impedance. A register bit may also be used to initiate a reset.

In one embodiment, the center frequency of the device is determined by the reference frequency (RFREQ) supplied to the DCO as control input M and the HS_DIV (see FIG. 8) and N1 output divider values. In one embodiment the device has the capability of storing four unique sets of RFREQ, HS_DIV, and N1 values representing four unique selectable output frequencies. There need not be a relationship between the four frequencies desired. That feature is useful in applications where a different output frequency is required depending on the system configuration. The FRQSEL[1:0] inputs 407 (FIG. 4) select which set of RFREQ, HS_DIV, and N1 values are used. If this feature is not desired, the FRQSEL[1:0] pins can be left floating, in which case default values are selected.

Note that the devices illustrated in FIGS. 3 and 4 can provide temperature compensation. That compensation is achieved by supplying the appropriate compensation value from non-volatile memory 317 based on the temperature detected by thermometer 351. Calibration for temperature compensation involves generating digital correction factors for various temperatures of interest.

In one embodiment temperature compensation values are determined as follows. First a reference temperature point is determined. The calibration at this temperature sets the RFREQ value to the DCO and all other temperature/frequency points are calculated with respect to this reference point. The reference temperature does not have to be the nominal ambient temperature of operation. To establish the reference temperature calibration point, a temperature calibration point register (TCP[2:0]) is set to 000, FRQSEL[1:0] =11 (if that feature is provided), and the device is brought to the desired reference temperature. The calibration clock is then applied through the serial port. When the clock is stopped, the M value corresponding to the frozen frequency and the temperature value are stored in the RFREQ_11 and RTEMP RAM registers, respectively. The stored values of M and the temperature are the values that existed immediately before the clock was stopped to avoid any glitches that might occur after the calibration clock is stopped.

To generate the calibration points across temperature, after establishing the reference temperature calibration point, TCP [2:0] is set to 001 to indicate the next temperature calibration point is being established, and FRQSEL[1:0] is set to 11, and the device is brought to the desired temperature. The calibration clock is applied as described previously. When the clock is stopped, the frozen delta-frequency value (relative to RFREQ_11) is stored in a DELMT1 register. The frozen delta-frequency value=(M at the reference temperature)−(M at the next temperature calibration point). The associated temperature is stored in the TEMP1 register. For each additional temperature calibration point, the temperature calibration point register is incremented and the calibration clock is reapplied at the desired temperature, and the new frozen delta-frequency value is stored along with the corresponding temperature. The temperature and delta M values are subsequently stored in non-volatile memory. During operation the M value at the reference temperature is used when the thermometer 351 indicates the reference temperature and appropriate offsets (supplied as DELMT) are supplied according to the temperature detected by thermometer 351. In other embodiments, the value of M at the particular temperature is stored, rather than delta M, and that value is supplied for temperature compensation.

In one embodiment the device can store up to six calibration points (frequency and temperature pairs), including the reference point, to calibrate the device across temperature. In normal operation with the temperature compensation feature turned on, the device interpolates between the provided calibration points using a polynomial of order N-1, where N is the umber of calibration points to be used, which in one embodiment is programmable using register bits. For example, if values are written into RFREQ_11, DELMT1, DELMT2, and DELMT3 while DELMT4 and DELMT5 are not to be used, the user set N=4 so that a 3rd order polynomial interpolation is used.

As illustrated in FIG. 4, and described above a multi-frequency feature is available using the frequency select inputs FREQSEL[1:0]. If the multi-frequency feature is used, establishing the correct M value for the additional frequencies is achieved by holding the device at the reference temperature, setting FREQSEL[1:0]=10, and reapplying the calibration clock at the appropriate frequency. When the clock is stopped, the frozen frequency control value is stored in RFREQ_10. If a third and fourth frequency are desired, repeat the above procedure with FRQSEL[1:0]=01 and 00, respectively.

In order to additionally compensate for temperature variations, which affect the reference frequency supplied, e.g., by the XO, the delta M over T value (DELMT) value is supplied to summing circuit 315 along with the reference frequency control value RFREQ. Thus, the control value generated at the reference temperature calibration point, along with an interpolated delta as described above, is supplied to summer 315 and utilized to generate the M value. Note that other temperature calibration algorithms besides the interpolation described above may be utilized. That function, in the embodiment illustrated in FIG. 4, is performed by the control circuit 341.

Figure 8:
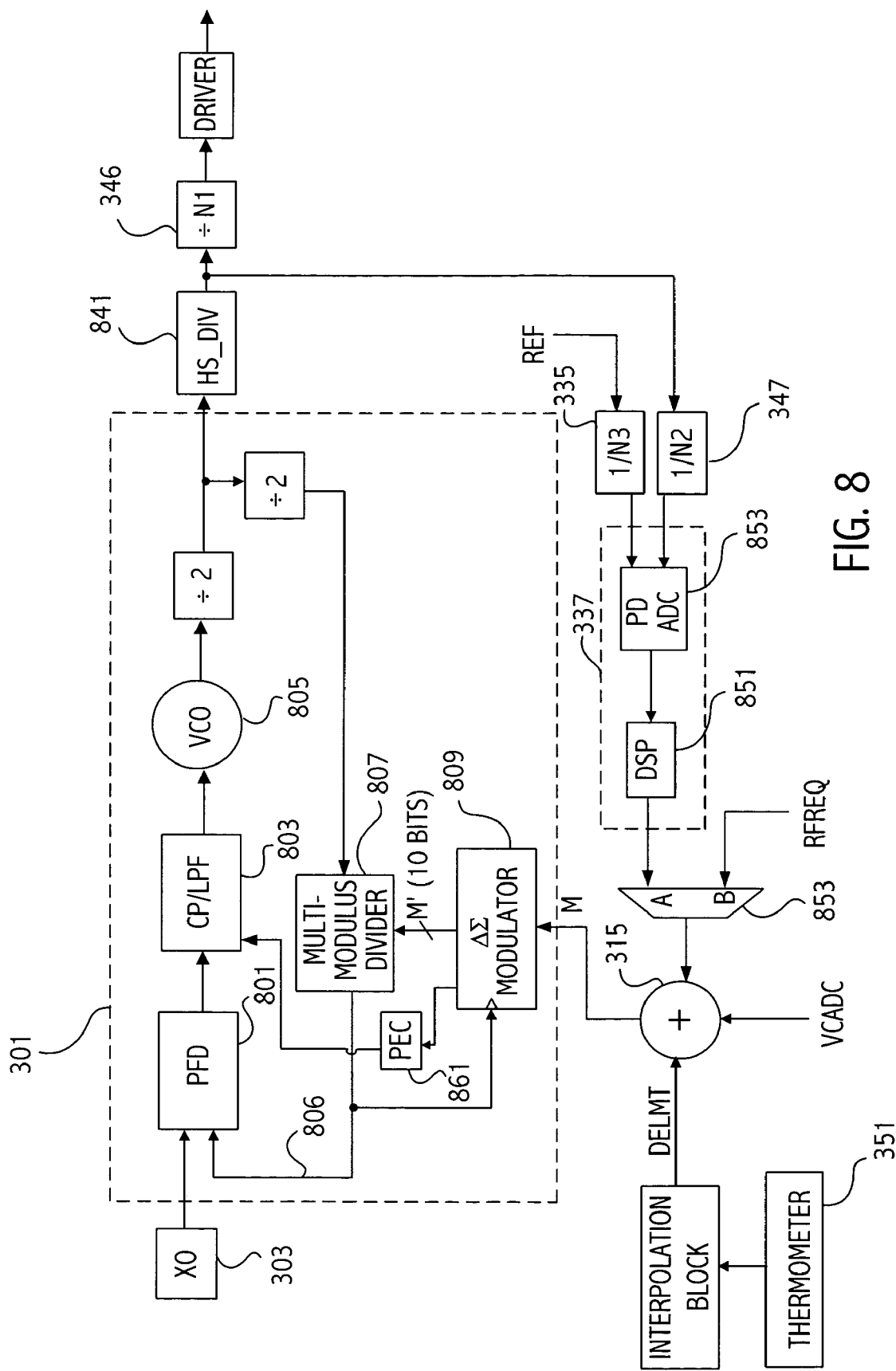
FIG. 8 illustrates an exemplary embodiment of the digitally controlled oscillator utilized in FIGS. 3 and 4.

Referring to FIG. 8, illustrated is an exemplary embodiment of the digitally controlled oscillator (DCO) 301. The crystal (or SAW) oscillator 303 supplies a timing reference to the DCO 301 as one input to the phase and frequency detector 801. Phase and frequency detector 801 generates an error term of the difference between the crystal oscillator input and the feedback from the VCO 805. Note that the feedback is supplied by multi-modulus divider block 807. During calibration, the DCO 301 functions as an inner loop having its feedback divider controlled by an outer loop that includes the dividers 335, 347, phase detector and analog to digital converter 853, filter 851, delta sigma modulator 809 as well as portions of the inner loop. The inner loop or DCO 301 is a fractional N loop wherein a period of the reference clock supplied by crystal or SAW 303 may be a non-integer multiple of a period of the oscillator clock signal supplied by VCO 805. Using a fractional N loop allows the use of low cost timing reference such as a low cost crystal oscillator. During normal operation, the DCO receives a control value from summing circuit 315 based on VCADC (from ADC 311 (FIG. 3)), DELMT, and RFREQ. Thus, the temperature compensation is achieved by adjusting the feedback loop of the DCO 301 through the delta sigma modulator 809, which is coupled to adjust the divider value supplied to the divide block 807.

Note that the inner loop forming DCO 301 utilizes a digital loop filter to allow the loop filter to be integrated onto the integrated circuit to reduce potential additional noise sources. Further, as described above, utilization of a digital loop filter allows an accurate implementation of the loop filter that is properly matched to the corners and the order of the noise shaping function and therefore can best reduce the jitter contribution from that source.

In one embodiment, the multi-modulus divider 807 is formed by a series of dividers. Because the feedback frequency may be in the GHz range, a prescalar is used to divide the feedback signal by, e.g., 4 or 5. Subsequent division stages, e.g., a plurality of divide by 4 and/or 5 stages further divide the feedback signal to an appropriate value according to the desired divider value.

Figure 9:
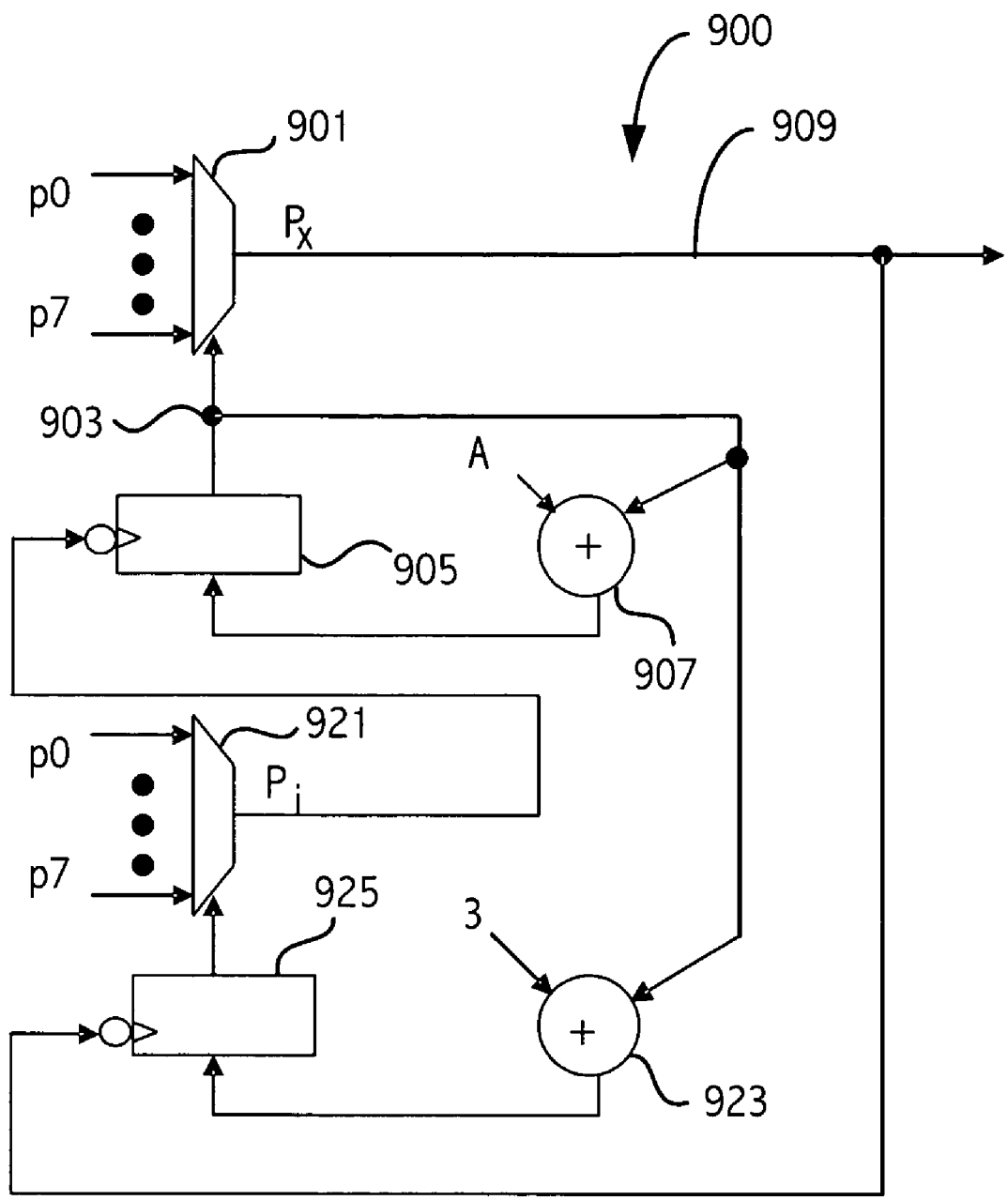
FIG. 9 illustrates a block diagram of an exemplary phase selectable divider circuit that may be utilized in the multi-modulus divider in FIG. 8.

Referring to FIG. 9 a block diagram of an exemplary phase selectable divider 900 is illustrated that may be utilized as part of the multi-modulus divider 807. Eight clock signals P0–P7 are supplied to selector circuit 901. In the illustrated embodiment, selector circuit 901 is implemented as a multiplexer. A three bit control signal 903 supplied from register 905 selects which of the clock signals P0 to P7 is output by the selector circuit. The clock signals P0–P7 have different phases. By selecting which clock signals are supplied by multiplexer 901, different frequency clock signals can be generated by the divider circuit.

Figure 10:
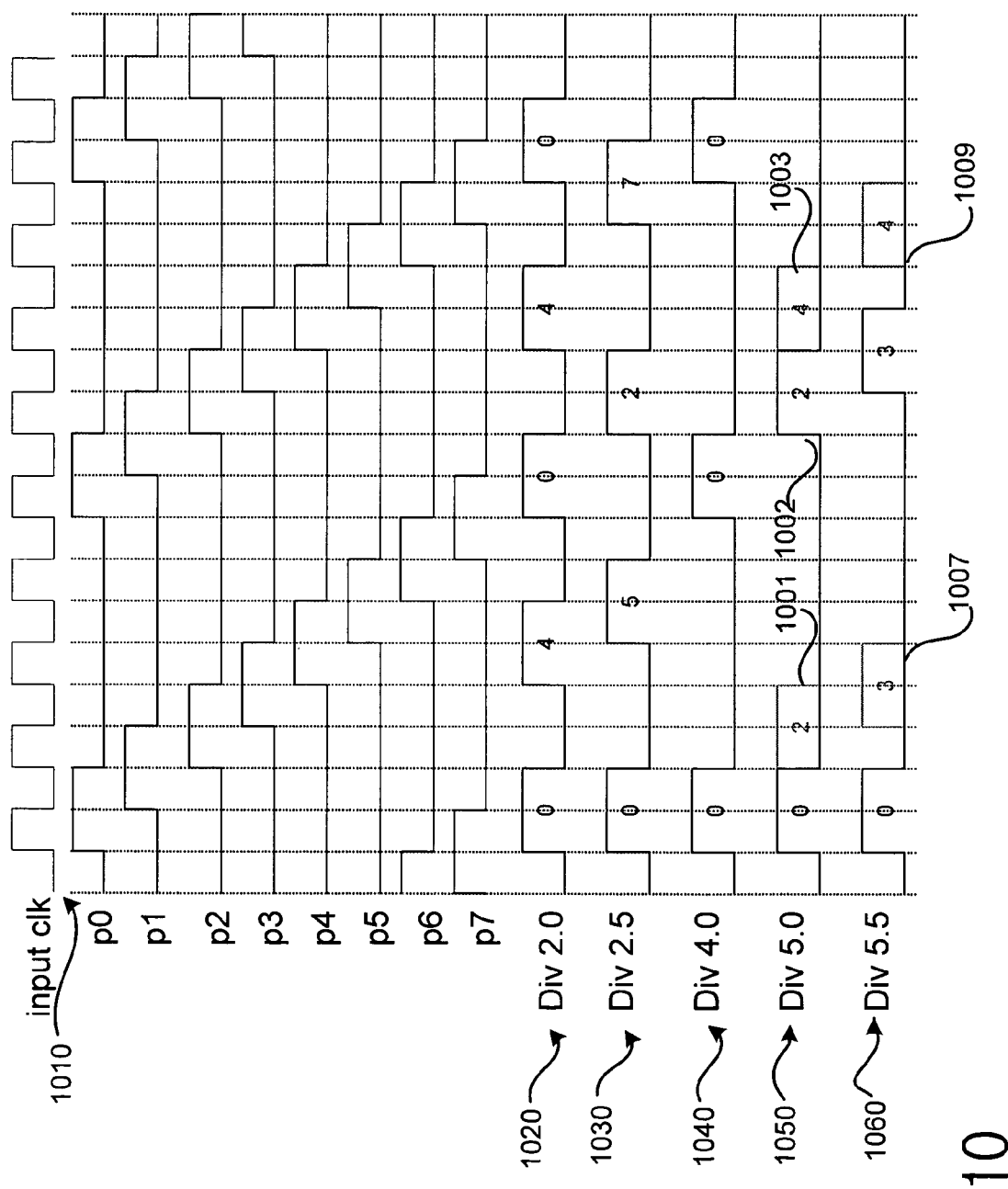
FIG. 10 illustrates operation of the phase selectable divider of FIG. 9.

Referring to FIG. 10, a timing diagram illustrates operation of the divider circuit 900. As shown in FIG. 10, the clock signals P0–P7 are derived from the divider input clock 1010. In one embodiment the divider input clock 1010 is approximately 2.5 gigahertz and the clock signals P0–P7 are one fourth of divider input clock signal, approximately 625 MHz. Referring again to FIG. 9, the divider circuit 900 selects the next pulse to be output by adding a value A to the current select signal 903 in summing circuit 907 to generate a sum that is supplied to register 905. The table below illustrates values of A supplied to summing circuit 907 to achieve various divide values.

TABLE 1

| A (mod 8) | A' (effective A) | Division Factor |
|---|---|---|
| 1 | 1 | 0.5 |
| 2 | 2 | 1.0 |
| 3 | 3 | 1.5 |
| 4 | 4 | 2.0 |
| 5 | 5 | 2.5 |
| 6 | 6 | 3.0 |
| 7 | 7 | 3.5 |
| 0 | 8 | 4.0 |
| 1 | 9 | 4.5 |
| 2 | 10 | 5.0 |
| 3 | 11 | 5.5 |

The use of the divider circuit 900 to generate a clock signal that is divided down from the divider input clock signal will now be illustrated with reference to FIG. 10. Assume it is desired to divide the divider input clock signal by 2.

Referring to the table above, it can be seen that in order to divide by 2 (the division factor), the appropriate value of A is 4. Assume that the currently selected clock is P0, so the select signal supplied from register 905 will be configured to select P0, e.g., using a value of 000. In order to select the next pulse output by the multiplexer, the summing circuit 407 adds the current value supplied from register 905 (which is 000) with the value of A (which is 4) and provides a sum of 4 to register 905 to select P4 as the next pulse output by multiplexer 901, as illustrated by the clock signal 1020 (Div 2.0) shown in FIG. 10. The sum circuit 907 is implemented as a modulo N summing circuit where N equals the number of clock signals supplied to multiplexer 401, which is 8 in the illustrated embodiment. With 4 as the current value of the select signals supplied by register 905, the next value supplied as the select signal is 0, which selects P0 as the next pulse to be output by the select circuit 901. That is, 4 (the value of the select signal)+4 (the value of A)=0 in a modulo 8 summing circuit. A is continually added to the current select value to generate the next pulse and a sequence of pulses selected from the phases P0 and P4 is output as shown in FIG. 10 to generate an output clock signal that equals divider input clock/2.

A divide by 2.5 will now be described. Assume that the currently selected clock is P0, so the select signal on control lines 903 will be configured to select P0, e.g., using a value of 000. Referring to Table 1, in order to divide by 2.5 (the division factor), the value of A is 5. The summing circuit 907 provides a sum of 5 to register 905 to select P5 as the next pulse output by multiplexer 901, as illustrated by the clock signal 1030 (Div 2.5) shown in FIG. 10. With 5 as the current value of the select signals, the next value supplied as the select signal is 2, which selects P2 as the next pulse to be output by the select circuit 901. That is, 5 (the value of the select signal)+5 (the value of A)=2 in a modulo 8 summing circuit. A is added to the current select value to generate the next select value, which is supplied to the select circuit. The next pulse selected is P7.

In the general case, for the circuit shown in FIG. 9, given 8 phases of a clock, with p(n) being the phase selected at a time "n", phase selection is accomplished by p(n+1)=(p(n)+A) mod 8. FIG. 10 also shows the pulses 540, 550, 560, selected, respectively for divide by 4, 5 and 5.5.

Referring to Table 1, note that for the embodiment illustrated in FIG. 9, the first three divide values (0.5, 1.0, 1.5) are not available. Also for longer divide operations, for example, divide by 4.5, 5, or 5.5, the first pulses output in the longer divides need to be ignored. This is illustrated in FIG. 10. Thus, for example, for a divide by 5, and assuming P0 is the initial pulse out, and A=2, the first P2 pulse 1001 is ignored but the second P2 pulse is supplied by multiplexer 901. Similarly, after the second P2 pulse 1002 is supplied, the first P4 pulse 1003 is ignored. With the first pulse ignored each time, the effective value of A=9. The resultant waveform 1050 supplied on node 909 is labeled Div 5.0 in FIG. 10. Similarly, the initial pulses 1007 and 1009 shown in FIG. 10 are ignored in a divide by 5.5 as shown in waveform 1060.

Referring again to FIG. 9, in order to achieve the necessary delay for the longer divides, e.g., the divide by 5 and 5.5 shown in FIG. 10, in one embodiment a second selector circuit 921 is utilized with a second summer circuit 923 and a second register 925. A skip delay value of 3 is added to the current select value 903 in summing circuit 923. The skip delay indicates how many phase steps (each of clocks P0–P7 being a phase step) should be skipped before the select signal in register 905 is updated. As shown in FIG. 9, the output clock from multiplexer 901 on node 909 is used to update register 925 with the sum from summing circuit 923. The clock selected by multiplexer 921 is used to update the register 905. That ensures that the value of the select signals do not change until after the first pulses have been skipped for A equal to 1, 2, or 3. For example, if the currently selected clock is P0 and A=1, with a skip count of 3, register 905 is not updated until P3, thereby ensuring that the first P1 pulse is skipped. Referring to FIG. 10, a skip delay of three ensures that the undesirable pulses 1001, 1003, 1007, and 1009 are not output. Note that in some embodiments, the multiplexer 901 may be coupled to receive an input signal that is a steady state input signal, e.g., ground, in addition to the various phase sets received. In that way, the multiplexer may be selected to output no signal.

Figure 11:
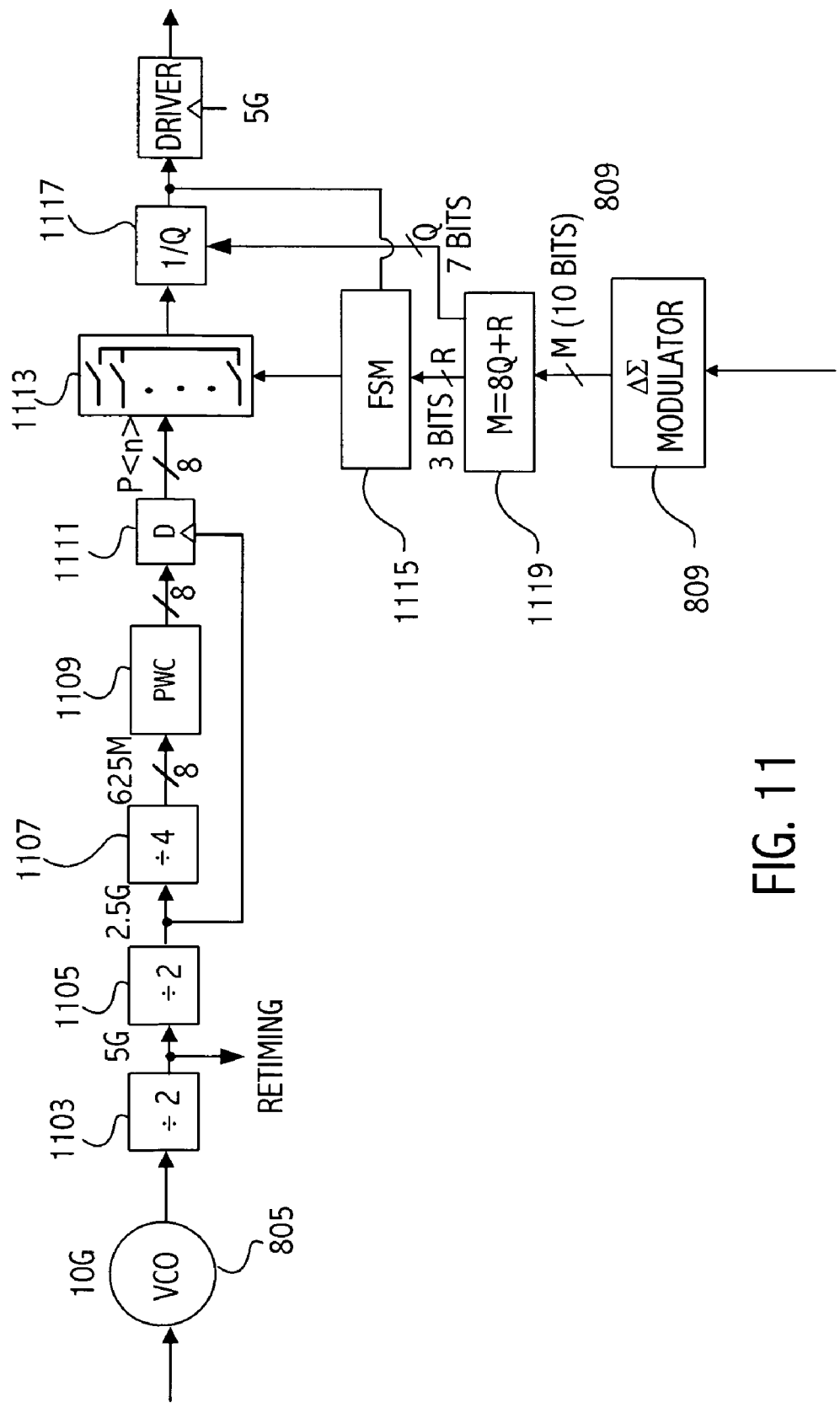
FIG. 11 illustrates an exemplary implementation of a multi-modulus divider.

FIG. 11 illustrates an embodiment of how a multi-modulus divider such as that illustrated in FIG. 9 may be utilized in the DCO 301 shown in FIG. 8. Referring to FIG. 11, a block diagram illustrates a multi-modulus programmable divider circuit according to an embodiment of the invention. The VCO 805 provides an approximately 10 GHz clock signal, which is divided down in dividers 1103 and 1105 to an approximately 2.5 GHz clock signal. In order to operate the divider at a high frequency with low power consumption, some embodiments avoid feeding control signals to the high-speed circuitry. Instead, one embodiment utilizes a minimum number of transistors in the high speed portion to save power and take advantage of the multiphase output of a divider described herein to achieve equivalent speed. The programmability is pushed into the lower frequency circuitry. The 5 GHz signal from node 1103 is fed to a cascade of two dividers, divider 1105, which is a divide-by-two and divider 1107, which is a divide-by-four phase generator that generates 8 different phases. Divider 1107 supplies pulse width controller (PWC) 1109, which in turns supplies an 8-to-1 phase selecting multiplexer 1113 through flip-flops 1111. The phase selecting multiplexer 1113 directs one of the eight (8) phases from the PWC 1109 to its output. The output of the multiplexer 1113 is used to clock a divide-by-Q counter (/Q) 1117, which generates the divider output. The output is also used to trigger a finite state machine (FSM) 1115, which implements the multiplexer control (phase selection) algorithm, e.g. as illustrated in FIGS. 9–10.

In one embodiment, as illustrated in FIG. 11, the delta sigma modulator 809 supplies a stream of integers M' to block 1119 by to provide fractional n divide capability. M' is a sequence of integers that approximates the rational number M. Note that in some embodiments, block 1119 may be incorporated into the finite sate machine 1115. Assuming the input frequency is $f_{in}$ and the output frequency is $f_{out}$, the divide ratio M=$f_{in}/f_{out}$. In one embodiment M=((9.7 GHz~11.32 GHz)/2)/(10 MHz (Xoxc)~320 MHz (SAW)) and thus M ranges from approximately 15 to approximately 566. In one embodiment the delta sigma modulator is an eight level quantizer that expands the fractional range to M−3 to M+4. The delta sigma modulator may be implemented, e.g., as a third order delta sigma modulator. Given that expansion of the fractional range of M, M ranges from approximately 12 to approximately 570. The divider circuit illustrated in FIG. 11 operates fundamentally as an integer divider with the M' value updated at a frequency varying from approximately 416 MHz for an M value of 12, to an update frequency of approximately 9 MHz for an M value of 570.

The operation of the divider described in FIG. 11 can be understood from the following arithmetic expression:

$$\begin{array}{r}Q\\8\sqrt{M'}\\\hline -8Q\\\hline R\end{array}$$

where Q is the quotient and R is the remainder, and M' is the divider ratio. From that arithmetic expression, the divide ratio M'=8 Q+R. The divide ratio is thus split into a constant coefficient (here 8, although other numbers are of course possible) multiplied by a quotient Q, which is >=1 and a remainder (R). The R portion is implemented through the phase-selecting multiplexer 1113 being controlled by the finite state machine (FSM) 1115. Control logic 1119 receives the divide ratio M', splits it into two portions, a Q number and an R number. The Q number is sent to Q divider 1117 input bits, while the R number is used by the finite state machine 1115. The 8 Q value can be understood as a coarse tuning capability, while the R value provides a finer tune capability.

The divide by 8, the constant coefficient, can be accomplished in the higher speed divide circuits 1105 and 1107. The divide by Q and the divide by R can be performed in lower speed circuitry. The divide by Q can be performed in variable divider circuit 1117, which has a much lower input frequency, thus can be implemented with low speed circuitry. The divide by R can be achieved in the phase selecting multiplexer 1113. The multiplexer 1113 chooses the phase that is R steps offset (R can be positive or negative) from the last phase in each cycle of the output, thus achieving the division factor 8 Q+R. Note that R is similar in function to A illustrated in FIGS. 9 and 10. By varying both Q and R, flexible programmability is achieved. Various values of R may be utilized examples of which are shown below.

R=(−4, −3, −2, −1, 0, 1, 2, 3)
R=(−3, −2, −1, 0, 1, 2, 3, 4),
R=(−2, −1, 0, 1, 2, 3, 4, 5),
R=(−1, 0, 1, 2, 3, 4, 5, 6),
R=(0, 1, 2, 3, 4, 5, 6, 7)

In each R scheme shown above, there are 8 values corresponding to each phase step. The R scheme chosen determines the minimum available division ratio and the maximum input frequency at the input of Q counter. For example, comparing scheme R=(−4, −3, −2, −1, 0, 1, 2, 3) to R=(0, 1, 2, 3, 4, 5, 6, 7), the first scheme can achieve the minimum divide ratio of /3, while the second one can only achieve the minimum divide ratio of /8. However the first scheme requires the Q counter to be able to operate at a much higher frequency. It also imposes tighter timing requirement on multiplexer control signal generation compared to other R scheme. It also consumes more power and may require custom design of the digital circuitry. Operation of R=(−3, −2, −1, 0, 1, 2, 3, 4), is illustrated in FIG. 12.

Figure 12:
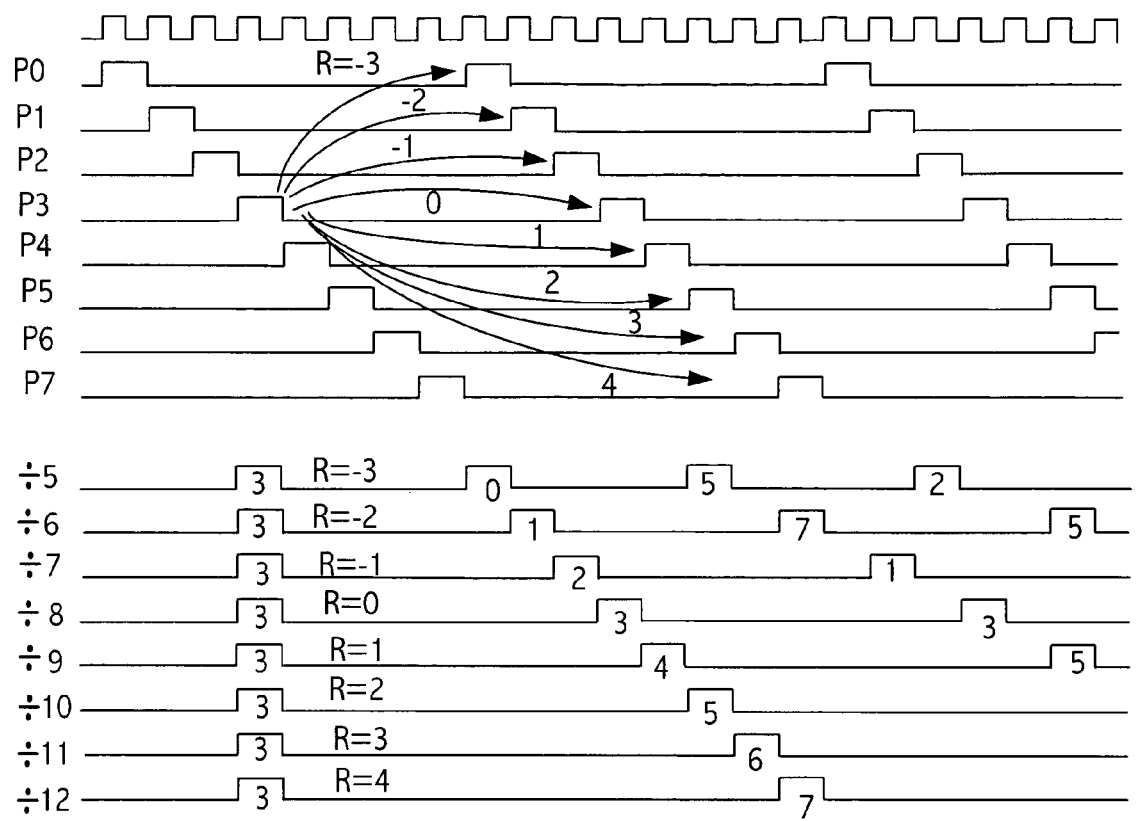
FIG. 12 illustrates operation of the multi-modulus divider shown in FIG. 11.

The top portion of FIG. 12 illustrates the input to the phase selecting multiplexer 1113, while the bottom portion of FIG. 12 illustrates the output for various divide values.

The use of the delta sigma modulator in a fractional N loop is illustrated in the following. Assume for example, that the value of M is 100 to achieve a desired nominal output frequency from DCO 301 (FIG. 3). The temperature compensation value determined by the interpolation described above may cause the value of M with temperature compensation to be 100.5. The delta sigma modulator in one embodiment provides an output having 8 different integer levels from −3 to 4, to represent the fractional portion, which values are combined with the integer portion (100) and mapped into the dividers of multi-modulus divide by N block 807. Thus, values ranging from 97 to 104 may be applied as divider values to the multi-modulus divide by N block 807. The use of the delta sigma modulator allows appropriate values to be used to average 100.5. Note that a value is generated by the divide block 807 at a rate of the XO (or other reference) clock frequency supplied on node 800.

Figure 13:
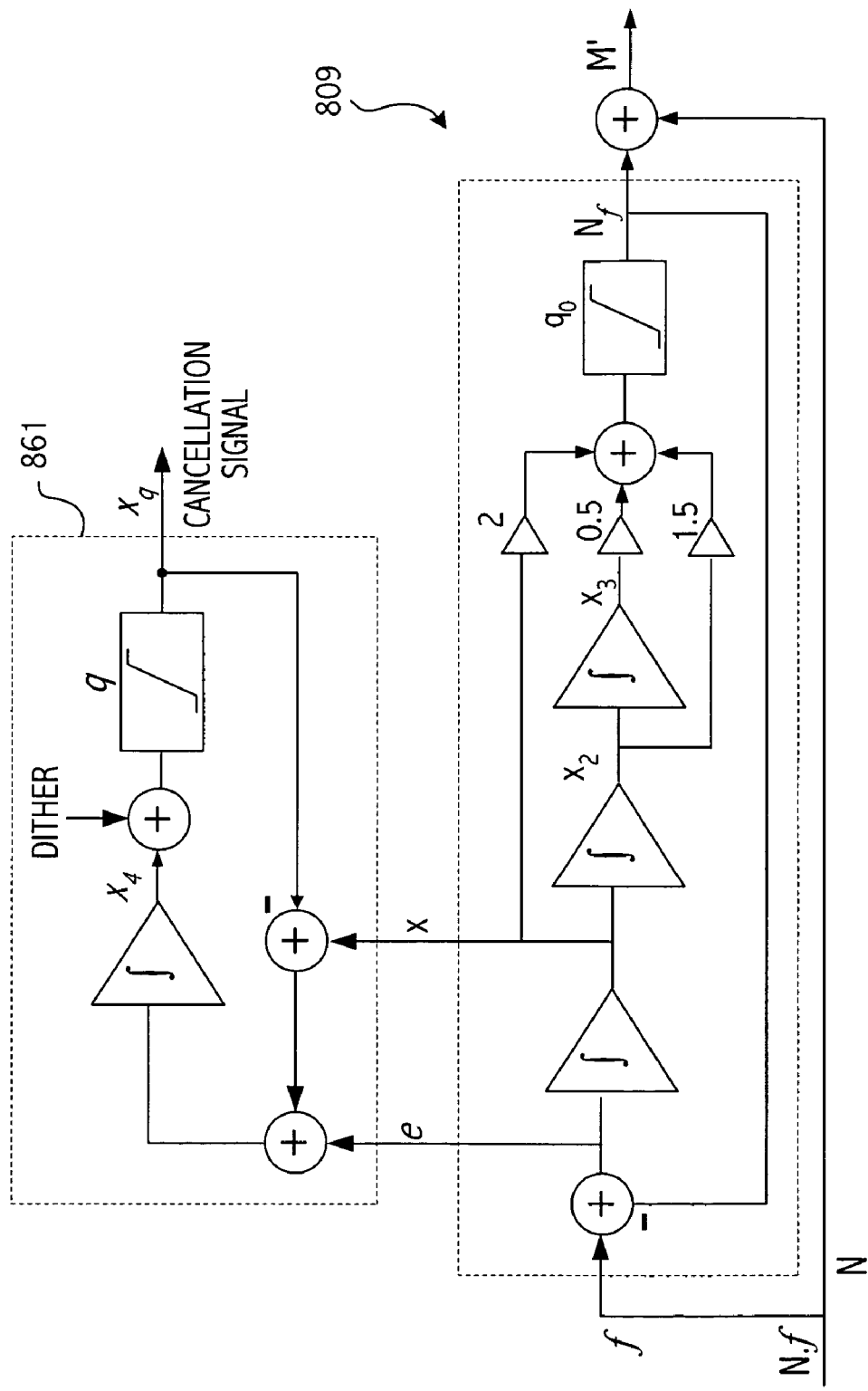
FIG. 13 illustrates the additional details of an embodiment of the delta sigma modulator and phase error cancellation (PEC) circuit shown in FIG. 8.

Note that noise shaping may be used to place any noise generated in the feedback divider in a frequency band that may be subsequently filtered by a low pass filter in the loop filter 803. Referring again to FIG. 8, the delta sigma modulator 809 supplies a stream of integers that approximates and averages the divide ratio desired. That introduces phase errors that can be compensated by the phase error correction logic 861. An embodiment of delta sigma modulator 809 is shown in FIG. 13. Delta sigma modulator receives as the divide control value M=N.f, where N is the integer portion of M and f is the fractional portion. The phase error correction logic 861 generates a phase error correction signal. Additional details on phase error correction can be found in the patent application Ser. No. 10/878,089, filed on Jun. 28, 2004, now U.S. Pat. No. 7,068,110 B2, entitled "Phase Error Correction", which application is incorporated by reference herein.

Referring again to FIG. 8, in another embodiment, the integrated circuit illustrated is coupled as a clock multiplier circuit to multiply the reference signal REF received at divider 335 and to supply the multiplied value as the output of DCO 301. In that embodiment phase detector and loop filter 337 supply a digital value to multiplexer 853, which in turn is supplied to delta sigma modulator 809. The multiplier value may be selected by setting the divide values in divide blocks 335 and 347. In various embodiments those values may be pin programmable, programmed via a serial port, or predetermined. When being used as a clock multiplier, the outer loop bandwidth is low to minimize jitter transfer from jitter present in the reference signal REF.

Figure 14:
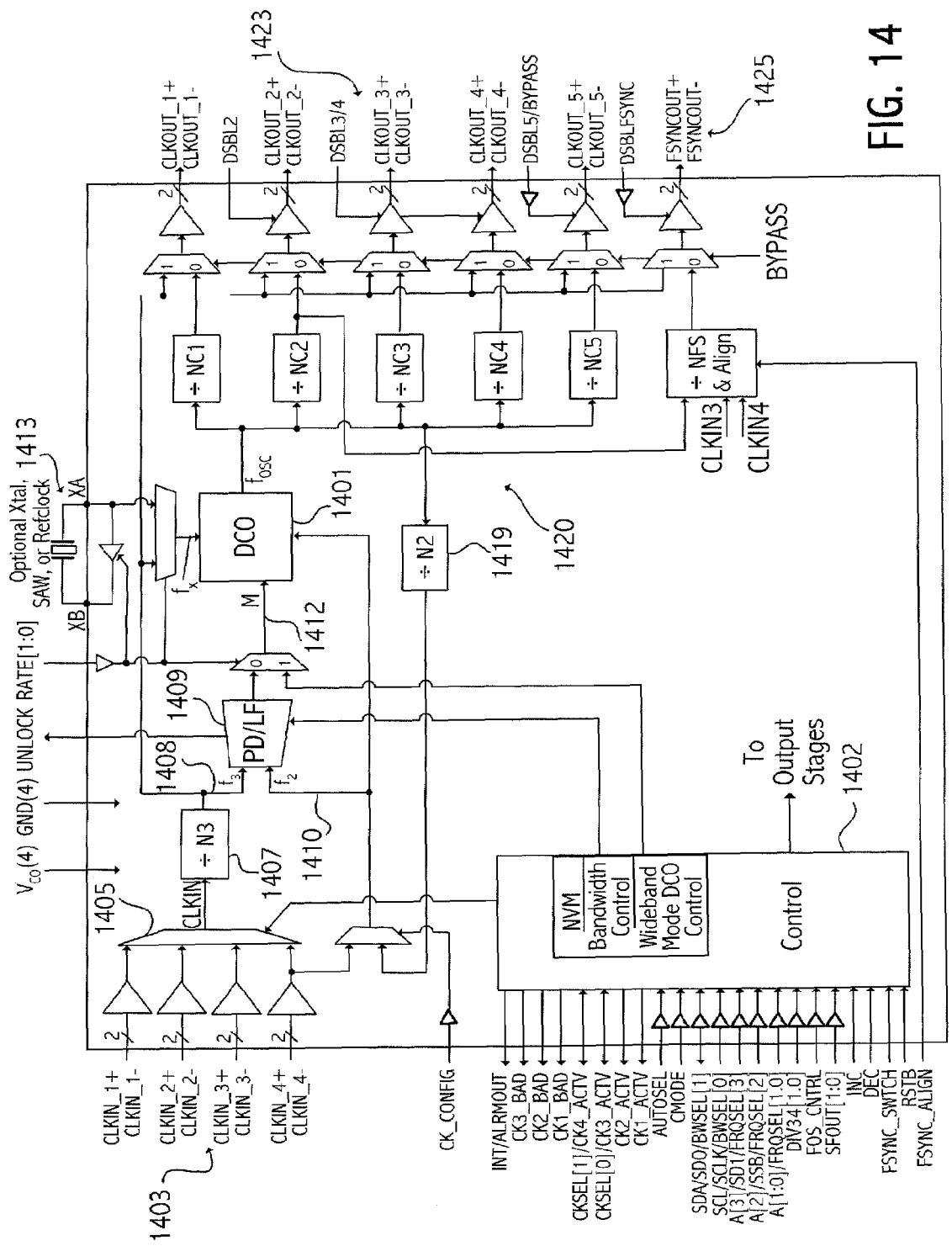
FIG. 14 illustrates a block diagram of a clock multiplier embodiment utilizing the dual loop architecture described in FIG. 8.

FIG. 14 provides a block diagram of an exemplary clock multiplier. Like the embodiment in FIGS. 3 and 4, FIG. 14 includes an digitally controlled oscillator (DCO) 1401, an embodiment of which was described in relation to FIG. 8. The reference clock to be multiplied is supplied on one of the clock inputs 1403 (CLKIN_1 to CLKIN_4). In one embodiment input clocks can range from 2 kHz to 800 MHz range and output clocks can be generated in the range of 2 kHz to 1.4175 GHz. In one embodiment the input clocks can hitlessly switch between the input clocks CLKIN_1–CLKIN_4 under either manual or automatic control. Another configuration supports two high-speed/frame sync clock pairs that can be switched in tandem. Control logic 1402 selects an appropriate clock to be output by selector circuit 1405. The selected clock is supplied to divider 1407 and then as a reference to the digital phase detector and loop filter 1409, which compares the reference signal $f_3$ supplied on node 1408 to the feedback signal $f_2$ supplied on node 1410 and generates an error signal indicative of the difference between the signals. The feedback signal $f_2$ supplied on node 1410 is coupled to the output of DCO 1401 through divider 1419. In clock multiplier mode, the control value M is supplied to the DCO 1401 on node 1412 and is determined based on the error between the reference signal and the feedback signal. As in FIG. 8, the control value M controls the operation of the DCO through its feedback divider. In other modes, e.g., wideband mode, the DCO control value M is supplied from the control logic 1402. The DCO can receive as its input clock, either a crystal, SAW or other reference clock input at 1413. The external crystal, SAW, or reference clock can be used to implement a digital hold function and to further improve low-frequency jitter generation. In digital hold mode an alarm from loss of signal (LOS) and/or optional frequency offset detectors (FOS) causes the digital control word M existing a programmable amount of time prior to the alarm to drive the DCO. When the alarm is removed, normal device operation can resume.

In one mode of operation, the input reference clock for the outer loop, i.e., supplied to divider 1407, may also be utilized as the input reference clock for the DCO 1401 through multiplexer 1415. In one embodiment there are five differential clock outputs signals 1423 (CLKOUT_1 to CLKOUT_5) plus a frame synchronization output 1425. The output of the DCO is supplied to the various output clock signals 1423 through output dividers 1420 (NC1–NC5). Note also that the feedback for the outer loop, in one operational mode supplied through divider 1419 to the digital phase detector 1409, can alternatively be fed back externally through one of the clock inputs 1403, e.g., CLKIN_4. The divide values of 1407, 1419, and the output dividers 1420 (NC1–NC5) may be programmed via pins or a communication interface to provide a desired multiplication value. A nonvolatile memory may be used to stored configuration settings. Other control/communication signals 1406 are supplied to/from the control logic 1411.

Thus, various embodiments have been described for implementing a clock source. The description of the invention set forth herein is illustrative, and is not intended to limit the scope of the invention as set forth in the following claims. For example, while a PLL has been described other control loops, such as a frequency locked loop may be utilized to generate appropriate correction/control values to calibrate the oscillator. Other variations and modifications of the embodiments disclosed herein, may be made based on the description set forth herein, without departing from the scope of the invention as set forth in the following claims.

What is claimed is:

1. An apparatus comprising:
  a phase-locked loop (PLL) circuit including an input for receiving a timing reference signal, a controllable oscillator circuit, and a feedback divider circuit;
  a control loop circuit configured to be selectively coupled to supply a control value to the feedback divider circuit to thereby control the oscillator output signal;
  a nonvolatile storage;
  wherein while the control loop circuit is not coupled to control the PLL circuit, the PLL circuit is coupled to receive a digital control value as the control value to control a divide ratio of the feedback divider, the digital control value being determined at least in part according to a stored control value stored in the nonvolatile storage, the stored control value corresponding to a desired frequency of the oscillator output signal; and wherein, while the control loop circuit is coupled to supply the control value to the feedback divider circuit, the control value is determined according to a detected difference between a feedback signal coupled to the oscillator circuit and a reference signal coupled to an input of the control loop circuit.

2. The apparatus as recited in claim 1 wherein the control value supplied is a digital control value.

3. The apparatus as recited in claim 1 wherein the apparatus is an integrated circuit.

4. The apparatus as recited in claim 1 wherein the feedback divider circuit is a multi-modulus feedback divider circuit.

5. The apparatus as recited in claim 1 further comprising:
a temperature compensation circuit coupled to supply an adjustment value according to a detected temperature, and wherein the control value supplied to the feedback divider circuit is adjusted according to the adjustment value, while the control loop circuit is not coupled to supply the control value to the feedback divider circuit.

6. The apparatus as recited in claim 1 further comprising a voltage control input to adjust a frequency of the oscillator output signal and wherein the control value supplied to the divider circuit is adjusted according to a voltage value present on the voltage control input.

7. The apparatus as recited in claim 1 further comprising a resonator supplying the timing reference signal.

8. The apparatus as recited in claim 7 wherein the resonator is one of a crystal oscillator and a surface acoustic wave (SAW) resonator.

9. The apparatus as recited in claim 1 wherein the control loop circuit is a phase-locked loop.

10. An apparatus comprising:
a phase-locked loop (PLL) circuit including an input for receiving a timing reference signal, a controllable oscillator circuit, and a feedback divider circuit;
a control loop circuit configured to be selectively coupled to supply a control value to the feedback divider circuit to thereby control the oscillator output signal;
a nonvolatile storage;
wherein while the control loop circuit is not coupled to control the PLL circuit, the PLL circuit is coupled to receive a digital control value as the control value to control a divide ratio of the feedback divider, the digital control value being determined at least in part according to a stored control value stored in the nonvolatile storage, the stored control value corresponding to a desired frequency of the oscillator output signal; and
wherein the stored control value in the non-volatile storage is based on a digital control value that was stored as a result of the control loop circuit detecting a lock condition indicating a signal coupled to an output of the oscillator circuit was locked to a reference signal coupled to an input of the control loop circuit.

11. An apparatus comprising:
a phase-locked loop (PLL) circuit including an input for receiving a timing reference signal, a controllable oscillator circuit, and a feedback divider circuit;
a control loop circuit configured to be selectively coupled to supply a control value to the feedback divider circuit to thereby control the oscillator output signal;
a nonvolatile storage;
wherein while the control loop circuit is not coupled to control the PLL circuit, the PLL circuit is coupled to receive a digital control value as the control value to control a divide ratio of the feedback divider, the digital control value being determined at least in part according to a stored control value stored in the nonvolatile storage, the stored control value corresponding to a desired frequency of the oscillator output signal; and
wherein the control loop circuit is implemented as a low bandwidth phase-locked loop and a bandwidth of the PLL circuit is substantially higher than the low bandwidth of the control loop circuit.

12. The apparatus as recited in claim 11 wherein the low bandwidth phase-locked loop has a bandwidth less than or equal to approximately 1 KHz and the substantially higher bandwidth of the PLL circuit is between approximately 10 KHz and 10 MHz.

13. A method comprising:
selectively coupling an inner loop circuit to have its output frequency determined, at least in part, by one of a first control value supplied by an outer loop circuit and a second control value corresponding to a stored control value in a nonvolatile storage; and
supplying the selectively coupled one of the first and second control values as a control value to control a divide ratio of a feedback divider circuit of the inner loop circuit;
wherein the method further comprises operating the outer loop circuit as a low bandwidth phase-locked loop and operating the inner loop circuit as a phase-locked loop having a substantially higher bandwidth than a bandwidth of the outer loop circuit.

14. The method as recited in claim 13 comprising:
supplying the inner loop with a timing reference signal from one of a crystal oscillator and a surface acoustic wave (SAW) device as an input into the inner loop circuit.

15. The method as recited in claim 14 wherein the inner loop circuit is a fractional N loop such that a period of the timing reference signal may be a non-integer multiple of a period of an output signal generated by the inner loop circuit.

16. The method as recited in claim 13 further comprising supplying a stream of integers from a delta sigma modulator corresponding to the control value to control the divide ratio of the feedback divider.

17. The method as recited in claim 13 further comprising determining the control value supplied to the inner loop circuit to control the divide ratio at least in part according to a detected temperature.

18. The method as recited in claim 13 further comprising determining the control value supplied to the inner loop circuit to control the divide ratio at least in part according to a control voltage supplied on a voltage control input terminal to adjust the output frequency of the inner loop circuit.

19. An integrated circuit comprising:
a first phase-locked loop (PLL) circuit including an input for receiving a timing reference signal, a controllable oscillator circuit, and a feedback divider circuit;
a non-volatile memory storing a stored value corresponding to a desired frequency of an output signal of the controllable oscillator circuit;
a second phase-locked loop circuit including a phase detector;
a selector circuit having inputs coupled to the phase detector of the second phase-locked loop circuit and to a control signal corresponding to the stored value in the nonvolatile memory, the selector circuit being coupled to provide a divider control signal to the feedback divider circuit.

20. An apparatus comprising:
a phase-locked loop (PLL) circuit including an input for receiving a timing reference signal, a controllable oscillator circuit, and a feedback divider circuit; and a control loop circuit configured to be selectively coupled to supply a control value to the feedback divider circuit to thereby control the oscillator output signal;

wherein the control loop circuit is selectively coupled though a selector circuit; and wherein the selector circuit is coupled to select between the control value supplied by the control loop circuit and another control value corresponding to a desired output frequency of the phase-locked loop stored in a non-volatile memory; and wherein the control loop circuit comprises a phase detector and the control value supplied by the control loop circuit corresponds to an indication from the phase detector of a difference between an output from the phase-locked loop circuit and a timing reference signal.

21. An apparatus comprising:
a fractional N inner loop circuit including,
  an input for receiving a timing reference signal;
  a feedback divider circuit; and
  a controllable oscillator circuit;
an outer loop circuit coupled to compare a feedback signal coupled to an output of the oscillator circuit and a reference signal coupled to an input of the outer loop circuit, and to generate an error signal indicative of the comparison; and
wherein the outer loop circuit is coupled to supply a divider control signal to control a divide ratio of the feedback divider circuit, the divider control signal being determined at least in part according to the error signal generated by the outer loop circuit; and
wherein the outer loop circuit has a bandwidth substantially lower than a bandwidth of the inner loop circuit.

22. The apparatus as recited in claim 21 wherein a desired output frequency is specified as a multiple of the reference clock signal.

23. The apparatus as recited in claim 21 further comprising a divider circuit coupled to the input of the outer loop circuit and coupled to supply the reference signal for comparison.

24. The apparatus as recited in claim 21 further comprising one of a crystal oscillator and a surface acoustic wave (SAW) resonator supplying the timing reference signal.

25. The apparatus as recited in claim 21 wherein the inner and outer loop circuits are phase-locked loops, each including a digital loop filter.

26. The apparatus as recited in claim 21 wherein the apparatus is an integrated circuit.

27. The apparatus as recited in claim 21 wherein the reference signal and the timing reference signal are coupled to a common source.

28. The apparatus as recited in claim 21 wherein the bandwidth of the outer loop circuit is less than or equal to approximately 1 KHz and the bandwidty of the inner loop circuit is between approximately 10 KHz and 10 MHz.

29. A method comprising:
receiving a first reference signal as an input to a first phase-locked loop (PLL) circuit;
generating an error signal in a second phase-locked loop indicative of a difference between a feedback signal coupled to an output of the first PLL circuit and a second reference signal coupled to an input of the second phase-locked loop, the second PLL circuit being a low bandwidth PLL; and
supplying a control signal, based at least in part on the error signal, to control a divider circuit in a feedback path of the first PLL circuit; and
operating the first PLL circuit with a substantially higher bandwidth than the second PLL circuit.

30. The method as recited in claim 29 wherein the control signal supplied is a digital signal.

31. The method as recited in claim 29 further comprising controlling the first PLL circuit output signal to be a desired multiple of the reference clock signal through programmable divider values.

32. The method as recited in claim 29 further comprising supplying the timing reference signal from one of a crystal oscillator and a surface acoustic wave (SAW) device.

* * * * *